US012805151B2

(12) United States Patent
Jun et al.

(10) Patent No.: US 12,805,151 B2
(45) Date of Patent: Nov. 17, 2026

(54) DISPLAY DEVICE AND DISPLAY PANEL

(71) Applicant: LG Display Co., Ltd., Seoul (KR)

(72) Inventors: Sungwoo Jun, Paju-si (KR); Hyunguk Jang, Seoul (KR); Youngsung Cho, Paju-si (KR)

(73) Assignee: LG Display Co., Ltd., Seoul (KR)

(*) Notice: Subject to any disclaimer, the term of this patent is extended or adjusted under 35 U.S.C. 154(b) by 630 days.

(21) Appl. No.: 18/449,474

(22) Filed: Aug. 14, 2023

(65) Prior Publication Data

US 2024/0260384 A1 Aug. 1, 2024

(30) Foreign Application Priority Data

Jan. 27, 2023 (KR) ........................ 10-2023-0010858

(51) Int. Cl.
*H10K 59/65* (2023.01)
*H10K 59/80* (2023.01)

(52) U.S. Cl.
CPC ....... *H10K 59/65* (2023.02); *H10K 59/80518* (2023.02); *H10K 59/80521* (2023.02)

(58) Field of Classification Search
CPC ............. H10K 59/65; H10K 59/80518; H10K 59/80521; H10K 59/123; H10K 59/80515; H10K 59/121; H10K 59/12; H10K 59/60; H10K 59/805; H10K 59/131; H10K 59/38; H10K 59/8052; H10K 59/878
See application file for complete search history.

(56) References Cited

U.S. PATENT DOCUMENTS

| | | | | |
|---|---|---|---|---|
| 11,502,148 | B2 | 11/2022 | Cai et al. | |
| 11,690,250 | B2 | 6/2023 | Cai et al. | |
| 2020/0168637 | A1* | 5/2020 | Kim | G02B 27/017 |
| 2020/0219958 | A1* | 7/2020 | Zhou | H10K 50/813 |
| 2021/0408152 | A1* | 12/2021 | Lou | H10K 59/80521 |
| 2022/0069042 | A1 | 3/2022 | Jung et al. | |

(Continued)

FOREIGN PATENT DOCUMENTS

| | | | |
|---|---|---|---|
| CN | 109994536 | A | 7/2019 |
| CN | 210575958 | U | 5/2020 |

(Continued)

OTHER PUBLICATIONS

Machine translation of CN111816788 A (Year: 2020).*

(Continued)

*Primary Examiner* — Mohammed R Alam
(74) *Attorney, Agent, or Firm* — Fenwick & West LLP

(57) ABSTRACT

A display device and a display panel are disclosed which comprise a first optical area included in a display area, the optical area for display an image displaying and being light transmittable. A normal area included in the display area is positioned around the first optical area, wherein each of the first optical area and the normal area includes a plurality of emission areas, wherein a light emitting element including an anode electrode, a light emitting layer, and a cathode electrode is disposed in each of the plurality of emission areas in the first optical area. An outer shape of the anode electrode disposed in the first optical area has a plurality of protrusions and a plurality of depressions that are alternately arranged, thereby reducing a flare due to lack of any angled portion in the anode electrode.

19 Claims, 22 Drawing Sheets

(56) References Cited

U.S. PATENT DOCUMENTS

| | | | | |
|---|---|---|---|---|
| 2022/0173169 | A1 | 6/2022 | Cai et al. | |
| 2022/0320459 | A1* | 10/2022 | Zhou | H10K 59/131 |
| 2023/0022759 | A1 | 1/2023 | Cai et al. | |

FOREIGN PATENT DOCUMENTS

| | | | | |
|---|---|---|---|---|
| CN | 111816788 | A | * 10/2020 | H04N 23/57 |
| CN | 112310325 | A | 2/2021 | |
| CN | 112462545 | A | 3/2021 | |
| CN | 114122059 | A | 3/2022 | |
| KR | 10-2022-0027448 | A | 3/2022 | |
| WO | WO 2020/220463 | A1 | 11/2020 | |
| WO | WO 2021/022873 | A1 | 2/2021 | |

OTHER PUBLICATIONS

European Patent Office, Extended European Search Report, European Patent Application No. 23196754.8, Feb. 9, 2024, eight pages.

* cited by examiner

DISPLAY DEVICE AND DISPLAY PANEL

CROSS-REFERENCE TO RELATED APPLICATION

This application claims priority from Republic of Korea Patent Application No. 10-2023-0010858, filed on Jan. 27, 2023, which is hereby incorporated by reference in its entirety.

BACKGROUND

Field

Embodiments of the disclosure relate to a display device and a display panel.

Description of Related Art

With the development of technology, the display device may provide a capture function and various detection functions in addition to an image display function. To this end, the display device includes an optical electronic device (also referred to as a light receiving device or sensor), such as a camera and a detection sensor.

Since the optical electronic device receives light from the front of the display device, the optical electronic device should be installed where light reception is easy. Accordingly, conventionally, the camera (camera lens) and the detection sensor had to be installed so as to be exposed on the front surface of the display device. Thus, the bezel of the display panel is widened or a notch or physical hole is formed in the display area of the display panel, and a camera or a detection sensor is installed there.

Therefore, as the display device is equipped with optical electronic devices such as cameras, detection sensors, etc. that perform a specified function by receiving light from the front of the display device, the front of the display device may have a large bezel or the front design of the display device may be restricted.

Further, when the display device includes an optical electronic device, an unexpected deterioration in image quality may occur depending on the structure for including the optical electronic device.

SUMMARY

Embodiments of the disclosure relate to a display device and a display panel having a light transmission structure in which an optical electronic device may normally receive light (e.g., visible light, infrared light, or ultraviolet light) without exposing the optical electronic device through the front surface of the display device.

Embodiments of the disclosure relate to a display device and a display panel having a unique arrangement structure for a light emitting element and a pixel circuit for driving the light emitting element in an optical area to enhance transmittance of the optical area.

Embodiments of the disclosure relate to a display device and a display panel having a unique connecting structure between a pixel circuit and a light emitting element to enhance transmittance in an optical area.

Embodiments of the disclosure relate to a display device and a display panel having a structure in which a transmission portion is present in an emission area disposed in an optical area to enhance transmittance of the optical area.

Embodiments of the disclosure relate to a display device and a display panel having an anode electrode reshaped in a light emitting element disposed in an optical area to enhance the quality of the image obtained through an optical electronic device disposed in the optical area.

In one embodiment, a display device comprises: a first optical area included in a display area, the first optical area configured to display an image and being light transmittable; a normal area included in the display area, the normal area around the first optical area; and a first optical bezel area included in the display area, the first optical bezel area positioned between the first optical area and the normal area, wherein each of the first optical area, the first optical bezel area, and the normal area includes a plurality of emission areas, wherein each of the plurality of emission areas in the first optical area includes a light emitting element comprising an anode electrode, a light emitting layer, and a cathode electrode, wherein an outer shape of at least one anode electrode in the first optical area comprises a plurality of protrusions and a plurality of depressions that are alternately arranged in a plan view of the display device.

In one embodiment, a display panel comprises: a first optical area included in a display area, the first optical area configured to display an image and being light transmittable; a normal area included in the display area, the normal area around the first optical area; and a first optical bezel area included in the display area, the first optical bezel area between the first optical area and the normal area, wherein each of the first optical area, the first optical bezel area, and the normal area includes a plurality of emission areas, and wherein at least one of the plurality of emission areas in the first optical area includes a light transmission portion and a reflective portion that surrounds the light transmission portion.

In one embodiment, a display panel comprises: a display area including a first area and a second area that surrounds the first area in a plan view of the display panel, the first area having a plurality of first emission areas configured to emit light and a plurality of light transmission areas, and the second area having a plurality of second emission areas configured to emit light but lacks a light transmission area; a first light emitting element including a first light emitting diode in one of the plurality of first emission areas in the first area and a first transistor connected to the first light emitting diode, the first transistor in a portion of the second area that surrounds the first area; a second light emitting element including a second light emitting diode in one of the plurality of second emission areas in the second area and a second transistor connected to the second light emitting diode, the second transistor in the second area; and an optical electronic device that overlaps the first area of the display panel.

According to embodiments of the disclosure, there may be provided a display device and a display panel having a light transmission structure in which an optical electronic device may normally receive light (e.g., visible light, infrared light, or ultraviolet light) without exposing the optical electronic device through the front surface of the display device.

According to embodiments of the disclosure, there may be provided a display device and a display panel having a unique arrangement structure for a light emitting element and a pixel circuit for driving the light emitting element in an optical area to enhance transmittance of the optical area.

According to embodiments of the disclosure, there may be provided a display device and a display panel having a unique connecting structure between a pixel circuit and a light emitting element to enhance transmittance in an optical area.

According to embodiments of the disclosure, there may be provided a display device and a display panel having a structure in which a transmission portion is present in an emission area disposed in an optical area to enhance transmittance of the optical area.

According to embodiments of the disclosure, there may be provided a display device and a display panel capable of low-power implementation by prolonging the lifespan of the light emitting element disposed in the optical area while enhancing the quality of the image obtained by the optical electronic device disposed in the optical area as the outer shape of the anode electrode disposed in the optical area is a curve other than a circle or ellipse.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1A:
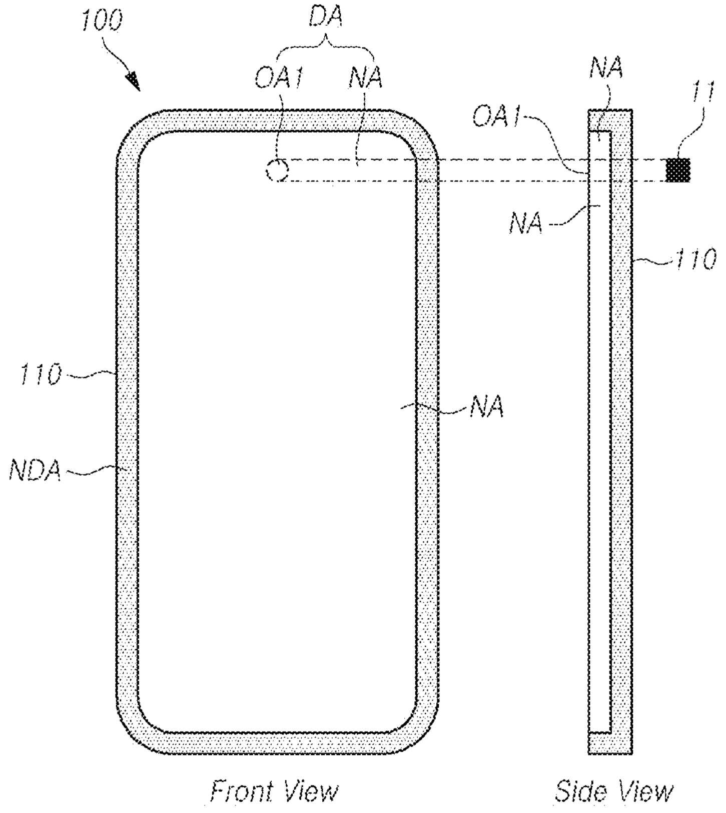
FIGS. 1A, 1B, and 1C illustrate a display device 100 according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "A", or "B" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

Hereinafter, various embodiments of the disclosure are described in detail with reference to the accompanying drawings. In describing the embodiments, descriptions of elements identical to or corresponding to those of the previous embodiments will be omitted. The embodiments are described below with reference thereto.

Figure 1B:
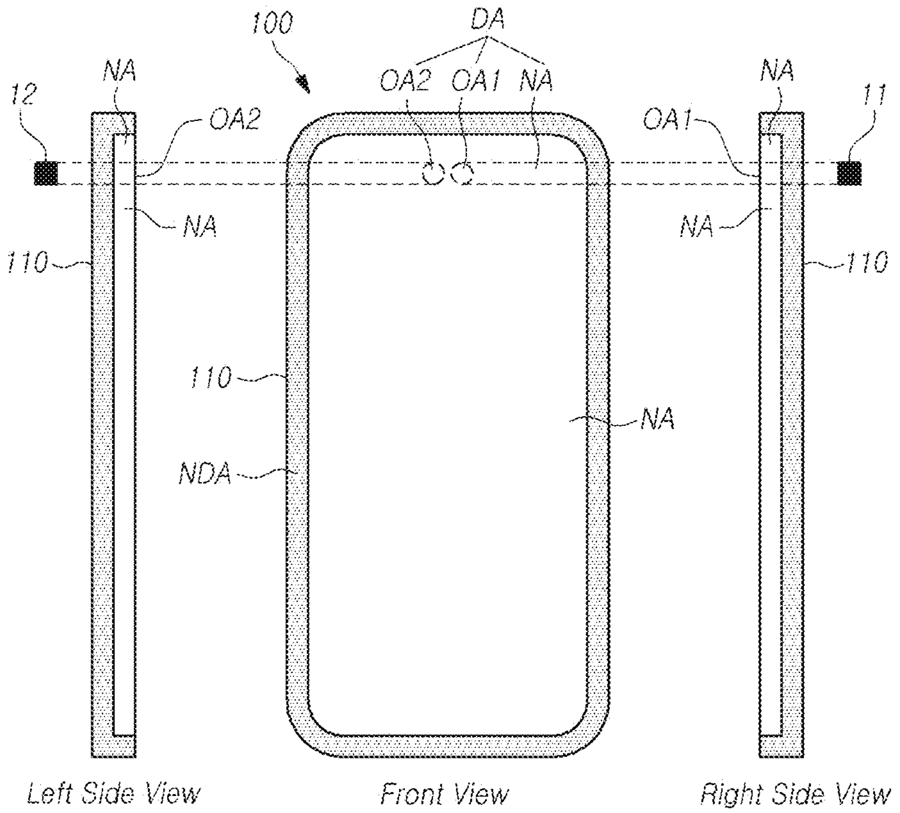
Figure 1C:
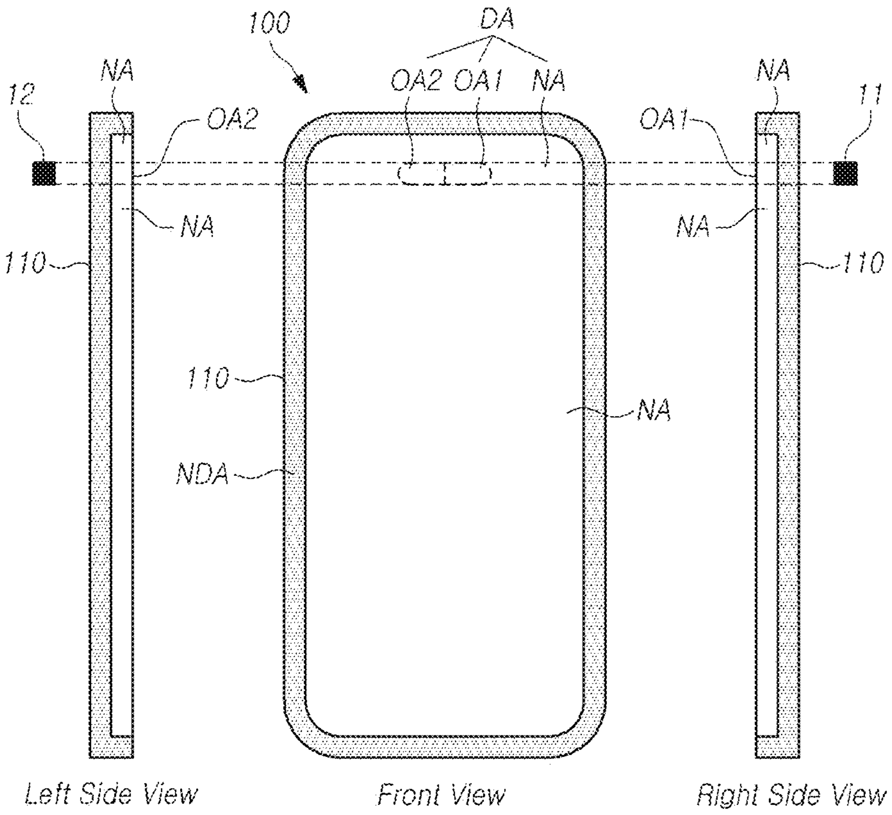

FIGS. 1A, 1B, and 1C illustrate a display device 100 according to embodiments of the disclosure.

Referring to FIGS. 1A, 1B, and 1C, a display device 100 according to embodiments of the disclosure may include a display panel 110 for displaying images and one or more optical electronic devices 11 and 12.

The display panel 110 may include a display area DA in which images (e.g., videos) may displayed and a non-display area NDA in which the image is not displayed.

A plurality of subpixels may be disposed in the display area DA, and various signal lines for driving the plurality of subpixels may be disposed in the display area AA.

The non-display area NDA may be an area outside the display area DA. In the non-display area NDA, various signal lines may be disposed, and various driving circuits may be connected thereto. The non-display area NDA may be bent to be invisible from the front or may be covered by a case (not shown). The non-display area NDA is also referred to as a bezel or a bezel area.

Referring to FIGS. 1A, 1B, and 1C, in the display device 100 according to embodiments of the disclosure, one or more optical electronic devices 11 and 12 are electronic components that are provided and installed separately from the display panel 110 and positioned under the display panel 110 (side opposite to the viewing surface).

Light enters the front surface (viewing surface) of the display panel 110 and passes through the display panel 110 to one or more optical electronic devices 11 and 12 positioned under the display panel 110 (opposite to the viewing surface). For example, the light passing through the display panel 110 may include visible light, infrared light, or ultraviolet light.

The one or more optical electronic devices 11 and 12 may be devices that receive the light transmitted through the display panel 110 and perform a predetermined function according to the received light. For example, the one or more optical electronic devices 11 and 12 may include one or more of a capture device, such as a camera (image sensor), and a detection sensor, such as a proximity sensor and an illuminance sensor. For example, the detection sensor may be an infrared sensor.

Referring to FIGS. 1A, 1B, and 1C, in the display panel 110 according to embodiments of the disclosure, the display area DA may include a normal area NA and one or more optical areas OA1 and OA2. The one or more optical areas OA1 and OA2 may be areas overlapping the one or more optical electronic devices 11 and 12. In one embodiment, the first optical area OA1 is considered a “first area” of the display area DA and the normal area NA is considered a “second area” of the display area in one embodiment.

According to the example of FIG. 1A, the display area DA may include the normal area NA and the first optical area OA1. At least a portion of the first optical area OA1 may overlap the first optical electronic device 11.

According to the example of FIG. 1B, the display area DA may include a normal area NA, a first optical area OA1, and a second optical area OA2. In the example of FIG. 1B, the normal area NA may be present between the first optical area OA1 and the second optical area OA2. At least a portion of the first optical area OA1 may overlap the first optical electronic device 11, and at least a portion of the second optical area OA2 may overlap the second optical electronic device 12.

According to the example of FIG. 1C, the display area DA may include a normal area NA, a first optical area OA1, and a second optical area OA2. In the example of FIG. 1C, the normal area NA is not present between the first optical area OA1 and the second optical area OA2. In other words, the first optical area OA1 and the second optical area OA2 touch each other. At least a portion of the first optical area OA1 may overlap the first optical electronic device 11, and at least a portion of the second optical area OA2 may overlap the second optical electronic device 12.

The one or more optical areas OA1 and OA2 should have both an image display structure and a light transmission structure. In other words, since the one or more optical areas OA1 and OA2 are partial areas of the display area DA, emission areas of subpixels for displaying images should be disposed in the one or more optical areas OA1 and OA2. A light transmission structure for transmitting light to the one or more optical and electronic devices 11 and 12 should be formed in one or more optical areas OA1 and OA2.

The one or more optical electronic devices 11 and 12 are devices that require light reception, but are positioned behind (below, opposite to the viewing surface) the display panel 110 to receive the light transmitted through the display panel 110. The one or more optical electronic devices 11 and 12 are not exposed on the front surface (viewing surface) of the display panel 110. Therefore, when the user looks at the front surface of the display device 110, the optical electronic devices 11 and 12 are not visible to the user.

For example, the first optical electronic device 11 may be a camera, and the second optical electronic device 12 may be a detection sensor, such as a proximity sensor or an illuminance sensor. For example, the detection sensor may be an infrared sensor that detects infrared rays. Conversely, the first optical electronic device 11 may be a detection sensor, and the second optical electronic device 12 may be a camera.

Hereinafter, for convenience of description, it is assumed that the first optical electronic device 11 is a camera and the second electronic device 12 is an infrared (IR)-based detection sensor. The camera may be a camera lens or an image sensor.

If the first optical electronic device 11 is a camera, the camera may be a front camera that is positioned behind (below) the display panel 110 but captures forward of the display panel 110. Accordingly, the user may take a photograph through the camera that is invisible to the viewing surface while viewing the viewing surface of the display panel 110.

The normal area NA and one or more optical areas OA1 and OA2 included in the display area DA are areas that may display images, but the normal area NA is an area that does not require a light transmission structure to be formed, and the one or more optical areas OA1 and OA2 are areas that require a light transmission structure to be formed due to the electronic device 11, 12 being in the one or more optical areas.

Accordingly, the one or more optical areas OA1 and OA2 should have a light transmittance that is higher than or equal to a certain level, and the normal area NA may have no light transmittance or a lower transmittance less than the certain level.

For example, one or more optical areas OA1 and OA2 and the normal area NA may have different resolutions, subpixel placement structures, numbers of subpixels per unit area, electrode structures, line structures, electrode placement structures, or line placement structures.

For example, the number of subpixels per unit area in one or more optical areas OA1 and OA2 may be less than the number of subpixels per unit area in the normal area NA. In other words, the resolution of one or more optical areas OA1 and OA2 may be less than the resolution of the normal area NA. Here, the number of subpixels per unit area may be meant to be equivalent to resolution, or pixel density, or pixel integration degree. For example, the unit for the number of subpixels per unit area may be pixels per inch (PPI), which means the number of pixels in one inch.

For example, the number of subpixels per unit area in the first optical area OA1 may be less than the number of subpixels per unit area in the normal area NA. The number of subpixels per unit area in the second optical area OA2 may be greater than or equal to the number of subpixels per unit area in the first optical area OA1 and be less than the number of subpixels per unit area in the normal area NA.

Meanwhile, as one method for increasing the light transmittance of at least one of the first optical area OA1 and the second optical area OA2, a pixel density differential design scheme may be applied as described above. According to the pixel density differential design scheme, the display panel 110 may be designed so that the number of subpixels per unit area of at least one of the first optical area OA1 and the second optical area OA2 is greater than the number of subpixels per unit area of the normal area NA.

However, in some cases, as another method for increasing the transmittance of at least one of the first optical area OA1 and the second optical area OA2, a pixel size differential design scheme may be applied. According to the pixel size differential design scheme, the display panel 110 may be designed so that the number of subpixels per unit area of at least one of the first optical area OA1 and the second optical area OA2 is identical or similar to the number of subpixels per unit area of the normal area NA, and the size of each subpixel (i.e., the size of the emission area) disposed in at least one of the first optical area OA1 and the second optical area OA2 is smaller than the size of each subpixel SP (i.e., the size of the emission area) disposed in the normal area NA.

Hereinafter, for convenience of description, it is assumed in the following description that, of the two schemes (pixel density differential design scheme and pixel size differential design scheme) for increasing the transmittance of at least one of the first optical area OA1 and the second optical area OA2, the pixel density differential design scheme is applied. Accordingly, that the number of subpixels per unit area is small, as described below, may be an expression corresponding to the subpixel size being small, and that the number of subpixels per unit area is large may be an expression corresponding to the subpixel size being large.

The first optical area OA1 may have various shapes, such as a circle, an ellipse, a quadrangle, a hexagon, or an octagon. The second optical area OA2 may have various shapes, such as a circle, an ellipse, a square, a hexagon, or an octagon. The first optical area OA1 and the second optical area OA2 may have the same shape or different shapes.

Referring to FIG. 1C, when the first optical area OA1 and the second optical area OA2 touch, the entire optical area including the first optical area OA1 and the second optical area OA2 may have various shapes, such as a circle, an ellipse, a square, a hexagon, or an octagon. Hereinafter, for convenience of description, each of the first optical area OA1 and the second optical area OA2 is exemplified as having a circular shape.

In the display device 100 according to embodiments of the disclosure, if the first optical electronic device 11 that is not exposed to the outside and is hidden in a lower portion of the display panel 100 is a camera, the display device 100 according to embodiments of the disclosure may be referred to as a display to which under display camera (UDC) technology has been applied.

Accordingly, the display device 100 according to embodiments of the disclosure does not require a notch or camera hole for camera exposure to be formed in the display panel 110, thereby preventing a reduction in the display area DA. Thus, as there is no need to form a notch or camera hole for exposure of the camera in the display panel 110, the size of the bezel area may be reduced, and design restrictions may be freed, thereby increasing the degree of freedom in design.

In the display device 100 according to embodiments of the disclosure, although one or more optical electronic devices 11 and 12 are positioned to be hidden behind the display panel 110, one or more optical electronic devices 11 and 12 should be able to normally perform predetermined functions by normally receiving light.

Further, in the display device 100 according to embodiments of the disclosure, although one or more optical electronic devices 11 and 12 are positioned to be hidden behind the display panel 110 and are positioned to overlap the display area DA, the one or more optical areas OA1 and OA2 overlapping the one or more optical electronic devices 11 and 12 in the display area DA should be capable of normal image display.

Since the above-mentioned first optical area OA1 is designed as a transmittable area, the image display characteristics in the first optical area OA1 may differ from the image display characteristics in the normal area NA.

Further, in designing the first optical area OA1 to enhance the image display characteristics, the transmittance of the first optical area OA1 may be degraded.

Accordingly, embodiments of the disclosure propose a structure of the first optical area OA1 capable of enhancing transmittance in the first optical area OA1 without causing an image quality deviation between the first optical area OA1 and the normal area NA.

Further, embodiments of the disclosure propose a structure of the second optical area OA2 capable of enhancing transmittance in the second optical area OA2 and image quality in the second optical area OA2 for the second optical area OA2, as well as for the first optical area OA1.

Further, in the display device 100 according to embodiments of the disclosure, the first optical area OA1 and the second optical area OA2 are similar in that they are light transmittable areas, but differ in use cases. Therefore, in the display device 100 according to embodiments of the disclosure, the structure of the first optical area OA1 and the structure of the second optical area OA2 may be designed to differ from each other.

Figure 2:
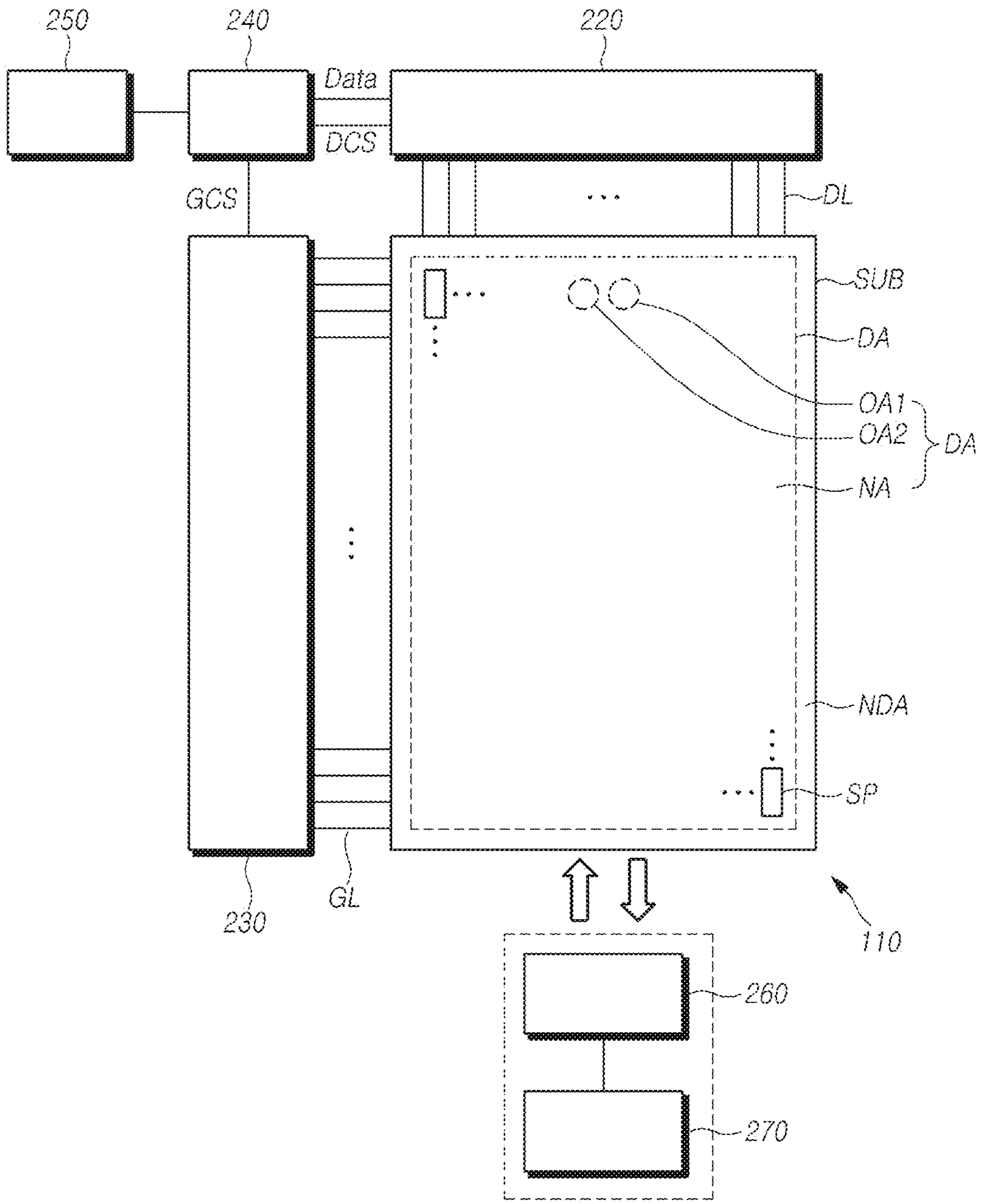
FIG. 2 is a view illustrating a system configuration of a display device according to embodiments of the disclosure.

FIG. 2 is a view illustrating a system configuration of a display device 100 according to embodiments of the disclosure.

Referring to FIG. 2, a display device 100 may include a display panel 110 and display driving circuits, as components for displaying images.

The display driving circuits are circuits for driving the display panel 110 and may include a data driving circuit 220, a gate driving circuit 230, and a display controller 240.

The display panel 110 may include the display area DA in which images are displayed and the non-display area NDA in which no image is displayed. The non-display area NDA may be an outer area of the display area DA and be referred to as a bezel area. The entire non-display area NDA or part of the non-display area NDA may be an area visible from the front surface of the display device 100 or an area that is bent and not visible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to embodiments of the disclosure may be a liquid crystal display device or a self-emission display device in which the display panel 110 emits light by itself. When the display device 100 according to the embodiments of the disclosure is a self-emission display device, each of the plurality of subpixels SP may include a light emitting element. For example, the display device 100 according to embodiments of the disclosure may be an organic light emitting diode display in which the light emitting element is implemented as an organic light emitting diode (OLED). As another example, the display device 100 according to embodiments of the disclosure may be an inorganic light emitting display device in which the light emitting element is implemented as an inorganic material-based light emitting diode. As another example, the display device 100 according to embodiments of the disclosure may be a quantum dot display device in which the light emitting element is implemented as a quantum dot which is self-emission semiconductor crystal.

The structure of each of the plurality of subpixels SP may vary according to the type of the display device 100. For example, when the display device 100 is a self-emission display device in which the subpixels SP emit light by themselves, each subpixel SP may include a light emitting element that emits light by itself, one or more transistors, and one or more capacitors.

For example, various types of signal lines may include a plurality of data lines DL transferring data signals (also referred to as data voltages or image signals) and a plurality of gate lines GL transferring gate signals (also referred to as scan signals).

The plurality of data lines DL and the plurality of gate lines GL may cross each other. Each of the plurality of data lines DL may be disposed while extending in a first direction. Each of the plurality of gate lines GL may be disposed while extending in a second direction. Here, the first direction may be a column direction and the second direction may be a row direction. The first direction may be the row direction, and the second direction may be the column direction.

The data driving circuit 220 is a circuit for driving the plurality of data lines DL, and may output data signals to the plurality of data lines DL. The gate driving circuit 230 is a circuit for driving the plurality of gate lines GL, and may output gate signals to the plurality of gate lines GL.

The display controller 240 is a device for controlling the data driving circuit 220 and the gate driving circuit 230 and may control driving timings for the plurality of data lines DL and driving timings for the plurality of gate lines GL.

The display controller 240 may supply a data driving control signal DCS to the data driving circuit 220 to control the data driving circuit 220 and may supply a gate driving control signal GCS to the gate driving circuit 230 to control the gate driving circuit 230.

The display controller 240 may receive input image data from the host system 250 and supply image data Data to the data driving circuit 220 based on the input image data.

The data driving circuit 220 may receive digital image data Data from the display controller 240 and may convert the received image data Data into analog data signals and output the analog data signals to the plurality of data lines DL.

The gate driving circuit 230 may receive a first gate voltage corresponding to a turn-on level voltage and a second gate voltage corresponding to a turn-off level voltage, along with various gate driving control signals GCS, generate gate signals, and supply the generated gate signals to the plurality of gate lines GL.

For example, the data driving circuit 220 may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 230 may be connected with the display panel 110 by TAB method or connected to a bonding pad of the display panel 110 by a COG or COP method or may be connected with the display panel 110 according to a COF method. Alternatively, the gate driving circuit 230 may be formed in a gate in panel (GIP) type, in the non-display area NDA of the display panel 110. The gate driving circuit 230 may be disposed on the substrate or may be connected to the substrate. In other words, the gate driving circuit 230 that is of a GIP type may be disposed in the non-display area NDA of the substrate. The gate driving circuit 230 that is of a chip-on-glass (COG) type or chip-on-film (COF) type may be connected to the substrate.

Meanwhile, at least one of the data driving circuit 220 and the gate driving circuit 230 may be disposed in the display area DA of the display panel 110. For example, at least one of the data driving circuit 220 and the gate driving circuit 230 may be disposed not to overlap the subpixels SP or to overlap all or some of the subpixels SP.

The data driving circuit 220 may be connected to one side (e.g., an upper or lower side) of the display panel 110. Depending on the driving scheme or the panel design scheme, data driving circuits 220 may be connected with both the sides (e.g., both the upper and lower sides) of the display panel 110, or two or more of the four sides of the display panel 110.

The gate driving circuit 230 may be connected to one side (e.g., a left or right side) of the display panel 110. Depending on the driving scheme or the panel design scheme, gate driving circuits 230 may be connected with both the sides (e.g., both the left and right sides) of the display panel 110, or two or more of the four sides of the display panel 110.

The display controller 240 may be implemented as a separate component from the data driving circuit 220, or the display controller 140 and the data driving circuit 220 may be integrated into an integrated circuit (IC).

The display controller 240 may be a timing controller used in typical display technology, a control device that may perform other control functions as well as the functions of the timing controller, or a control device other than the timing controller, or may be a circuit in the control device. The display controller 240 may be implemented as various circuits or electronic components, such as an integrated circuit (IC), a field programmable gate array (FPGA), an application specific integrated circuit (ASIC), or a processor.

The display controller 240 may be mounted on a printed circuit board or a flexible printed circuit and may be electrically connected with the data driving circuit 220 and the gate driving circuit 230 through the printed circuit board or the flexible printed circuit.

The display controller 240 may transmit/receive signals to/from the data driving circuit 220 according to one or more predetermined interfaces. The interface may include, e.g., a low voltage differential signaling (LVDS) interface, an embedded clock point-point interface (EPI) interface, and a serial peripheral interface (SPI).

To provide a touch sensing function as well as an image display function, the display device 100 according to embodiments of the disclosure may include a touch sensor and a touch sensing circuit that senses the touch sensor to detect whether a touch occurs by a touch object, such as a finger or pen, or the position of the touch.

The touch sensing circuit may include a touch driving circuit 260 that drives and senses the touch sensor and generates and outputs touch sensing data and a touch controller 270 that may detect an occurrence of a touch or the position of the touch using touch sensing data.

The touch sensor may include a plurality of touch electrodes. The touch sensor may further include a plurality of touch lines for electrically connecting the plurality of touch electrodes and the touch driving circuit 260.

The touch sensor may be present in a touch panel form outside the display panel 110 or may be present inside the display panel 110. When the touch panel, in the form of a touch panel, exists outside the display panel 110, the touch panel is referred to as an external type. When the touch sensor is of the external type, the touch panel and the display panel 110 may be separately manufactured or may be combined during an assembly process. The external-type touch panel may include a touch panel substrate and a plurality of touch electrodes on the touch panel substrate.

When the touch sensor is present inside the display panel 110, the touch sensor may be formed on the substrate SUB, together with signal lines and electrodes related to display driving, during the manufacturing process of the display panel 110.

The touch driving circuit 260 may supply a touch driving signal to at least one of the plurality of touch electrodes and may sense at least one of the plurality of touch electrodes to generate touch sensing data.

The touch sensing circuit may perform touch sensing in a self-capacitance sensing scheme or a mutual-capacitance sensing scheme.

When the touch sensing circuit performs touch sensing in the self-capacitance sensing scheme, the touch sensing circuit may perform touch sensing based on capacitance between each touch electrode and the touch object (e.g., finger or pen). According to the self-capacitance sensing scheme, each of the plurality of touch electrodes may serve both as a driving touch electrode and as a sensing touch electrode. The touch driving circuit 260 may drive all or some of the plurality of touch electrodes and sense all or some of the plurality of touch electrodes.

When the touch sensing circuit performs touch sensing in the mutual-capacitance sensing scheme, the touch sensing circuit may perform touch sensing based on capacitance between the touch electrodes. According to the mutual-capacitance sensing scheme, the plurality of touch electrodes are divided into driving touch electrodes and sensing touch electrodes. The touch driving circuit 260 may drive the driving touch electrodes and sense the sensing touch electrodes.

The touch driving circuit 260 and the touch controller 270 included in the touch sensing circuit may be implemented as separate devices or as a single device. The touch driving circuit 260 and the data driving circuit 220 may be implemented as separate devices or as a single device.

The display device 100 may further include a power supply circuit for supplying various types of power to the display driver integrated circuit and/or the touch sensing circuit.

The display device 100 according to embodiments of the disclosure may be a mobile terminal, such as a smart phone or a tablet, or a monitor or television (TV) in various sizes but, without limited thereto, may be a display in various types and various sizes capable of displaying information or images.

As described above, the display area DA in the display panel 110 may include the normal area NA and one or more optical areas OA1 and OA2. The normal area NA and one or more optical areas OA1 and OA2 are areas capable of displaying an image. However, the normal area NA is an area where a light transmission structure is not required to be formed, and one or more optical areas OA1 and OA2 are areas in which a light transmission structure is to be formed.

As described above, the display area DA in the display panel 110 may include one or more optical areas OA1 and OA2 together with the normal area NA, but for convenience of description, it is assumed that the display area DA includes both the first optical area OA1 and the second optical area OA2 (FIGS. 1B and 1C).

Figure 3:
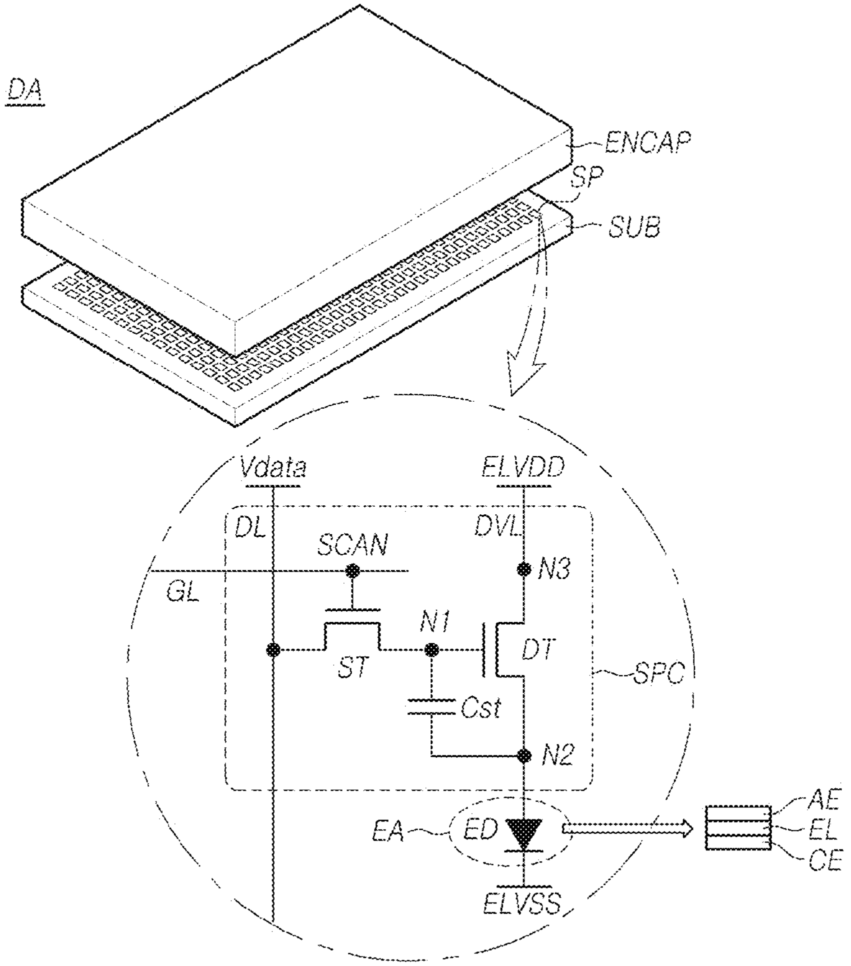
FIG. 3 is a view schematically illustrating a display panel according to embodiments of the disclosure.

FIG. 3 is a view schematically illustrating a display panel 110 according to embodiments of the disclosure.

Referring to FIG. 3, a plurality of subpixels SP may be disposed in the display area DA of the display panel 110. The plurality of subpixels SP may be disposed in the normal area NA and the first optical area OA1 and the second optical area OA2 included in the display area DA.

Referring to FIG. 3, each of the plurality of subpixels SP may include a light emitting element ED and a pixel circuit SPC configured to drive the light emitting element ED.

Referring to FIG. 3, the pixel circuit SPC may include a driving transistor DT for driving the light emitting element ED, a scan transistor ST for transferring the data voltage Vdata to the first node N1 of the driving transistor DT, and a storage capacitor Cst for maintaining a constant voltage during one frame.

The driving transistor DT may include the first node N1 to which the data voltage may be applied, a second node N2 electrically connected with the light emitting element ED, and a third node N3 to which a driving voltage ELVDD is applied from a driving voltage line DVL. The first node N1 in the driving transistor DT may be a gate node, the second node N2 may be a source node or a drain node, and the third node N3 may be the drain node or the source node. For convenience of description, described below is an example in which the first node N1 in the driving transistor DT is a gate node, the second node N2 is a source node, and the third node N3 is a drain node.

The light emitting element ED may include an anode electrode AE, a light emitting layer EL, and a cathode electrode CE. The anode electrode AE may be a pixel electrode disposed in each subpixel SP and be electrically connected to the second node N2 of the driving transistor DT of each subpixel SP. The cathode electrode CE may be a common electrode commonly disposed in the plurality of subpixels SP, and a base voltage ELVSS may be applied thereto.

For example, the anode electrode AE may be a pixel electrode, and the cathode electrode CE may be a common electrode. Conversely, the anode electrode AE may be a common electrode, and the cathode electrode CE may be a pixel electrode. Hereinafter, for convenience of description, it is assumed that the anode electrode AE is a pixel electrode and the cathode electrode CE is a common electrode.

The light emitting element ED may have a predetermined emission area EA. The emission area EA of the light emitting element ED may be defined as an area where the anode electrode AE, the light emitting layer EL, and the cathode electrode CE overlap.

For example, the light emitting element ED may be an organic light emitting diode (OLED), an inorganic light emitting diode, or a quantum dot light emitting element. When the light emitting element ED is an organic light emitting diode, the light emitting layer EL of the light emitting element ED may include an organic light emitting layer EL including an organic material.

The scan transistor ST may be on/off controlled by a scan signal SCAN, which is a gate signal, applied via the gate line GL and be electrically connected between the first node N1 of the driving transistor DT and the data line DL.

The storage capacitor Cst may be electrically connected between the first node N1 and second node N2 of the driving transistor DT.

The pixel circuit SPC may have a 2T (transistor) 1C (capacitor) structure which includes two transistors DT and ST and one capacitor Cst as shown in FIG. 3 and, in some cases, each subpixel SP may further include one or more transistors or one or more capacitors.

The capacitor Cst may be an external capacitor intentionally designed to be outside the driving transistor DT, but not a parasite capacitor (e.g., Cgs or Cgd) which is an internal capacitor that may be present between the first node N1 and the second node N2 of the driving transistor DT. Each of the driving transistor DT and the scan transistor ST may be an n-type transistor or a p-type transistor.

Since the circuit elements (particularly, the light emitting element ED implemented as an organic light emitting diode (OLED) containing an organic material) in each subpixel SP are vulnerable to external moisture or oxygen, an encapsulation layer ENCAP may be disposed on the display panel 110 to prevent penetration of external moisture or oxygen into the circuit elements (particularly, the light emitting element ED). The encapsulation layer ENCAP may be disposed to cover the light emitting elements ED.

Figure 4:
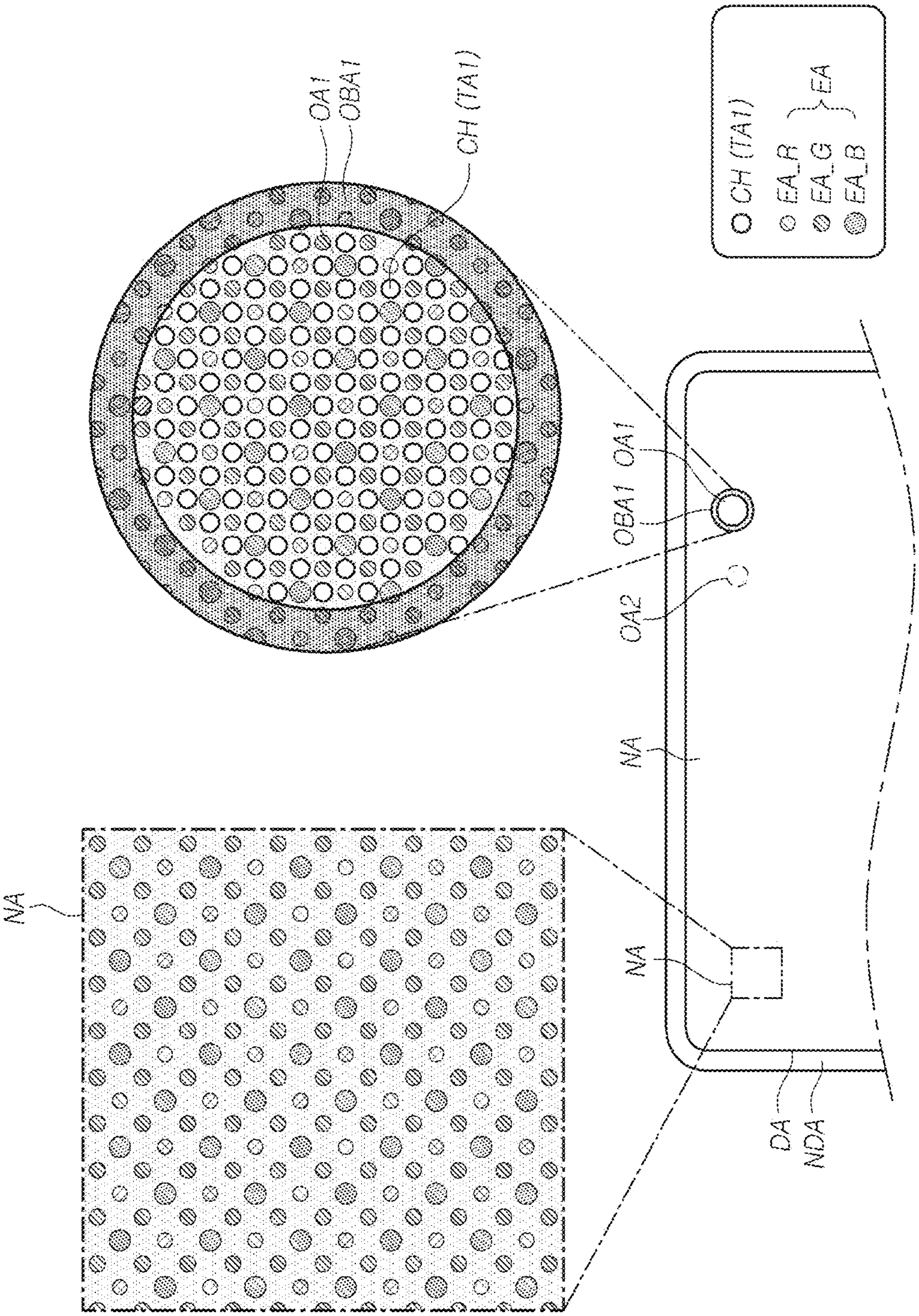
FIG. 4 schematically illustrates a first optical area of a first type and a normal area around the first optical area in a display panel according to embodiments of the disclosure.

FIG. 4 schematically illustrates a first optical area OA1 of a first type and a normal area NA around the first optical area in a display panel 110 according to embodiments of the disclosure.

Referring to FIG. 4, the display panel 110 according to embodiments of the disclosure may include a display area DA in which images are displayed and a non-display area NDA in which no image is displayed.

Referring to FIG. 4, the display area DA may include a transmittable first optical area OA1 and a normal area NA around the first optical area OA1.

The first optical area OA1 may have a structure of a first type. As such, when the first optical area OA1 is of the first type, the first optical bezel area OBA1 may be disposed outside the first optical area OA1. In embodiments of the disclosure, the first optical bezel area OBA1 may be regarded as a portion of the normal area NA.

In other words, when the first optical area OA1 is of the first type, the display area DA may include the first optical area OA1, the normal area NA positioned outside the first optical area OA1, and the first optical bezel area OBA1, which is an area between the first optical area OA1 and the normal area NA.

Referring to FIG. 4, the first optical area OA1 is an area overlapping the first optical electronic device 11 and may be a transmittable area through which light required for operation of the first optical electronic device 11 may pass.

Here, the light passing through the first optical area OA1 may include light of a single wavelength band or may include light of various wavelength bands. For example, the light passing through the first optical area OA1 may include at least one of visible light, infrared light, or ultraviolet light.

The first optical electronic device 11 may receive light passing through the first optical area OA1 and perform a predetermined operation using the received light. Here, the light received by the first optical electronic device 11 through the first optical area OA1 may include at least one of visible light, infrared light, or ultraviolet light.

For example, when the first optical electronic device 11 is a camera, the light transmitted through the first optical area OA1 and used by the first optical electronic device 11 may include visible light. As another example, when the first optical electronic device 11 is an infrared sensor, the light transmitted through the first optical area OA1 and used in the first optical electronic device 11 may include infrared light (also referred to as infrared light beam or ray).

Referring to FIG. 4, the first optical bezel area OBA1 may be an area positioned outside the first optical area OA1. The normal area NA may be an area positioned outside the first optical bezel area OBA1. Thus, the first optical bezel area OBA1 may be disposed between the first optical area OA1 and the normal area NA.

For example, the first optical bezel area OBA1 may be disposed outside a part of the perimeter of the first optical area OA1 and may be disposed outside the entire perimeter of the first optical area OA1.

When the first optical bezel area OBA1 is disposed outside the entire perimeter of the first optical area OA1, the first optical bezel area OBA1 may have a ring shape surrounding the first optical area OA1.

For example, the first optical area OA1 may have various shapes, such as circular, elliptical, polygonal, or irregular shapes. The first optical bezel area OBA1 may have various ring shapes (e.g., a circular ring shape, an elliptical ring shape, a polygonal ring shape, or an irregular ring shape) surrounding the first optical area OA1 having various shapes.

Referring to FIG. 4, the display area DA may include a plurality of emission areas EA. Since the first optical area OA1, the first optical bezel area OBA1, and the normal area NA are areas included in the display area DA, each of the first optical area OA1, the first optical bezel area OBA1, and the normal area NA may include a plurality of emission areas EA.

For example, the plurality of light emitting areas EA may include a first color light emitting area emitting light of a first color, a second color light emitting area emitting light of a second color, and a third color light emitting area emitting light of a third color.

At least one of the first color emission area, the second color emission area, and the third color emission area may have a different area from the remaining emission areas of different colors.

The first color, the second color, and the third color are different colors and may be various colors. For example, the first color, the second color, and the third color may include red, green, and blue, respectively.

Hereinafter, for convenience of description, a case in which the first color is red, the second color is green, and the third color is blue is exemplified. However, it is not limited thereto.

When the first color is red, the second color is green, and the third color is blue, among the area of the red emission area EA_R, the area of the green emission area EA_G, and the area of the blue emission area EA_B, the area of the blue emission area EA_B may be the largest emission area.

The light emitting element ED disposed in the red emission area EA_R may include a light emitting layer EL emitting red light. The light emitting element ED disposed in the green emission area EA_G may include a light emitting layer EL emitting green light. The light emitting element ED disposed in the blue emission area EA_B may include a light emitting layer EL emitting blue light.

Among the light emitting layer EL emitting red light, the light emitting layer EL emitting green light, and the light emitting layer EL emitting blue light, an organic material included in the light emitting layer EL emitting blue light may be most easily deteriorated.

Since the area of the blue emission area EA_B is designed to be the largest, the density of the current supplied to the light emitting element ED disposed in the blue emission area EA_B may be the smallest. Accordingly, the degree of deterioration of the light emitting element ED disposed in the blue light emitting area EA_B may be similar to the degree of deterioration of the light emitting element ED disposed in the red light emitting area EA_R and the degree of deterioration of the light emitting element ED disposed in the green light emitting area EA_G.

Accordingly, the deterioration deviations between the light emitting element ED disposed in the red light emitting area EA_R, the light emitting element ED disposed in the green light emitting area EA_G, and the light emitting element ED disposed in the blue light emitting area EA_B may be removed or reduced, thereby improving image quality. Further, the deterioration deviations between the light emitting element ED disposed in the red light emitting area EA_R, the light emitting element ED disposed in the green light emitting area EA_G, and the light emitting element ED disposed in the blue light emitting area EA_B may be removed or reduced, thereby reducing the lifetime deviations between the light emitting element ED disposed in the red light emitting area EA_R, the light emitting element ED disposed in the green light emitting area EA_G, and the light emitting element ED disposed in the blue light emitting area EA_B.

Referring to FIG. 4, the first optical area OA1 is a transmittable area and must have high transmittance. To that end, the cathode electrode CE may include a plurality of cathode holes CH in the first optical area OA1. In other words, in the first optical area OA1, the cathode electrode CE may include a plurality of cathode holes CH.

Referring to FIG. 4, the cathode electrode CE does not include the cathode hole CH in the normal area NA. In other words, in the normal area NA, the cathode electrode CE does not include the cathode hole CH.

Further, the cathode electrode CE does not include the cathode hole CH in the first optical bezel area OBA1. In other words, in the first optical bezel area OBA1, the cathode electrode CE does not include the cathode hole CH.

In the first optical area OA1, the plurality of cathode holes CH formed in the cathode electrode CE may also be referred to as a plurality of first transmission areas TA1 or a plurality of openings. Here, in FIG. 4, one cathode hole CH has a circular shape, but may have other angle-less shapes, such as of ellipses.

As such, since the outer shape of the cathode hole CH has an angle-less shape, it is possible to prevent a flare due to the cathode hole CH.

Referring to FIG. 4, the second optical area OA2 may be disposed adjacent to the first optical area OA1. The arrangement of the emission areas EA in the second optical area OA2 is described below in more detail.

A light emitting element ED may be disposed in each of the plurality of emission areas EA_R, EA_G, and EA_B disposed in the first optical area OA1.

The light emitting element ED may include an anode electrode AE, a light emitting layer EL, and a cathode electrode CE.

In the display device 100 according to embodiments of the disclosure, the anode electrodes AE of the emission areas disposed in the first optical area OA1 may be formed in various shapes.

The light emitting element ED disposed in the red emission area EA_R disposed in the first optical area OA1 may include a first anode electrode, the light emitting element ED disposed in the green emission area EA_G may include a second anode electrode, and the light emitting element ED disposed in the blue emission area EA_B may include a third anode electrode. The first to third anode electrodes may be formed in various shapes.

The outer shapes of the first to third anode electrodes disposed in the first optical area OA1 may be different from the outer shapes of the anode electrodes disposed in the first optical bezel area OBA1 and the normal area NA.

Figure 5:
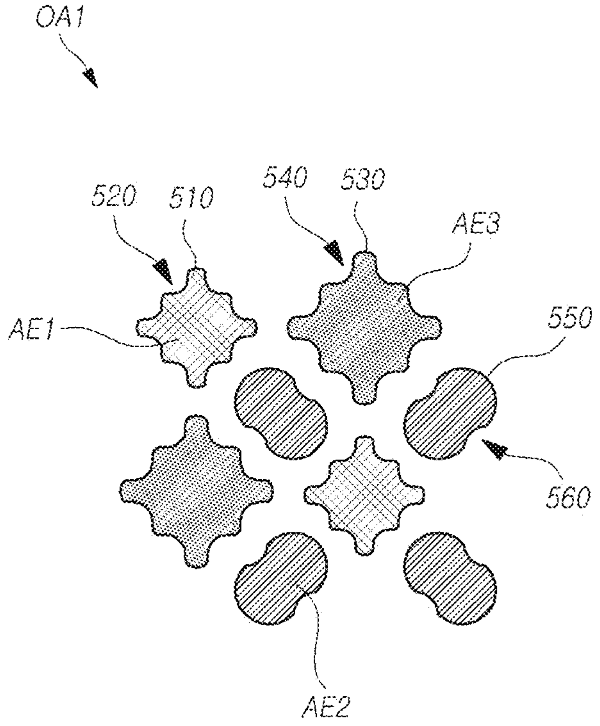
FIG. 5 is a plan view specifically illustrating shapes of anode electrodes disposed in a first optical area in a display panel according to embodiments of the disclosure.

FIG. 5 is a plan view specifically illustrating shapes of anode electrodes disposed in a first optical area in a display panel according to embodiments of the disclosure.

Referring to FIG. 5, in the display panel 100 according to embodiments of the disclosure, a plurality of emission areas emitting light of different colors may be disposed in the first optical area OA1. For example, as illustrated in FIG. 5, a first anode electrode AE1, a second anode electrode AE2, and a third anode electrode AE3 may be disposed in the first optical area OA1.

Here, the emission area of the display panel 100 refers to an area overlapping an opening of a bank disposed on a portion of an upper surface of the anode electrode.

The planar shapes of emission areas emitting light of at least two different colors among emission areas emitting light of different colors may be different from each other. The planar shapes of emission areas emitting light of the same color may be identical to each other.

For example, as illustrated in FIG. 5, the first anode electrode AE1 and the third anode electrode AE3 disposed in the first optical area OA1 may have planar shapes different from those of the second anode electrode AE2.

Further, referring to FIG. 5, the first anode electrodes AE1 disposed in the first optical area OA1 may have the same planar shape as each other, the second anode electrodes AE2 disposed in the first optical area OA1 may have the same planar shape, and the third anode electrodes AE3 disposed in the first optical area OA1 may have the same planar shape.

The periphery of each of the emission areas (e.g., the edges) disposed in the first optical area OA1 may have an angle-less curved shape. However, each of the first anode electrode AE1, the second anode electrode AE2, and the third anode electrode AE3 disposed in the first optical area OA1 may not have a circular shape or an elliptical shape.

For example, as illustrated in FIG. 5, the outer shape of the first anode electrode AE1 disposed in the first optical area OA1 may be a shape in which first protrusions 510 and first depressions 520 are alternately disposed. The first protrusion 510 and the first depression 520 may have a curved shape in a plan view of the display device.

Referring to FIG. 5, the outer shape of the third anode electrode AE3 disposed in the first optical area OA1 may be a shape in which second protrusions 530 and second depressions 540 are alternately disposed. The second protrusion 530 and the second depression 540 may have a curved shape in the plan view.

The outer shape of the first anode electrode AE1 and the outer shape of the third anode electrode AE3 may be substantially the same. However, the first anode electrode AE1 and the third anode electrode AE3 may have different sizes as shown in FIG. 5.

However, the outer shape of the first anode electrode AE1 and the outer shape of the third anode electrode AE3 according to embodiments of the disclosure are not limited thereto, and the outer shape of the first anode electrode AE1 and the outer shape of the third anode electrode AE3 may be different from each other.

Referring to FIG. 5, the outer shape of the second anode electrode AE2 disposed in the first optical area OA1 may be a shape in which third protrusions 550 and third depressions 560 are alternately disposed. The third protrusion 550 and the third depression 560 may have a curved shape in the plan view.

Further, referring to FIG. 5, the outer shape of the second anode electrode AE2 may be different from the outer shape of the first anode electrode AE1 and the outer shape of the third anode electrode AE3.

For example, the number of third protrusions 550 provided at the periphery of the second anode electrode AE2 may be less than the numbers of protrusions 510 and 530, respectively, provided at the peripheries of the first anode electrode AE1 and the third anode electrode AE3.

Further, the number of third depressions 560 provided at the periphery of the second anode electrode AE2 may be less than the numbers of depressions 520 and 540, respectively, provided at the peripheries of the first anode electrode AE1 and the third anode electrode AE3.

Here, the numbers of protrusions and depressions provided at the respective peripheries of the first anode electrode AE1 and the third anode electrode AE3 may be the same in one embodiment.

However, as illustrated in FIG. 5, the first to third protrusions 510, 530, and 550 may have different sizes, and the first to third depressions 520, 540, and 560 may also have different sizes.

Further, the shapes of one first protrusion 510 and another first protrusion 510 included in the first anode electrode AE1 may be different from each other, and the shapes of one first depression 520 and another first depression 520 may also be different from each other.

Similarly, the shapes of one second protrusion 530 and another second protrusion 530 included in the second anode electrode AE2 may be different from each other, and the shapes of one second depression 540 and another second depression 540 may be different from each other, and the shapes of one third protrusion 550 and another third protrusion 550 included in the third anode electrode AE3 may be different from each other, and the shapes of one third depression 560 and another third depression 560 may be different from each other.

As illustrated in FIG. 5, the respective outer shapes of the first anode electrode AE1, the second anode electrode AE2, and the third anode electrode AE3 disposed in the first optical area OA1 may have no angled portion (e.g., no straight edges).

When at least a portion of the periphery of the first to third anode electrodes AE1, AE2, and AE3 disposed in the first optical area OA1 is formed in an angular shape, a flare may occur in the first optical area OA1. In other words, when photographing by the first optical electronic device, diffuse reflection may occur due to light rays other than normal refraction, causing rounded spots or chunks of light shaped as horizontal, vertical, or oblique lines.

Further, when the outer shapes of the first to third anode electrodes AE1, AE2, and AE3 disposed in the first optical area OA1 are circular or elliptical, the area of each anode electrode is reduced, so that the lifespan of the light emitting element may reduce.

In the first optical area OA1 of the display device 100 according to embodiments of the disclosure, each of the first to third anode electrodes AE1, AE2, and AE3 is formed to have an angle-less shape other than a circular or elliptical shape, thereby preventing or at least reducing a flare while enhancing the lifespan of the light emitting elements disposed in the first optical area OA1.

In particular, no angled portion is present in the outer shape of each of the first to third anode electrodes AE1, AE2, and AE3 so that light may be scattered in several directions, preventing or at least reducing a flare in a straight line, such as a horizontal, vertical, or oblique line.

Figure 6:
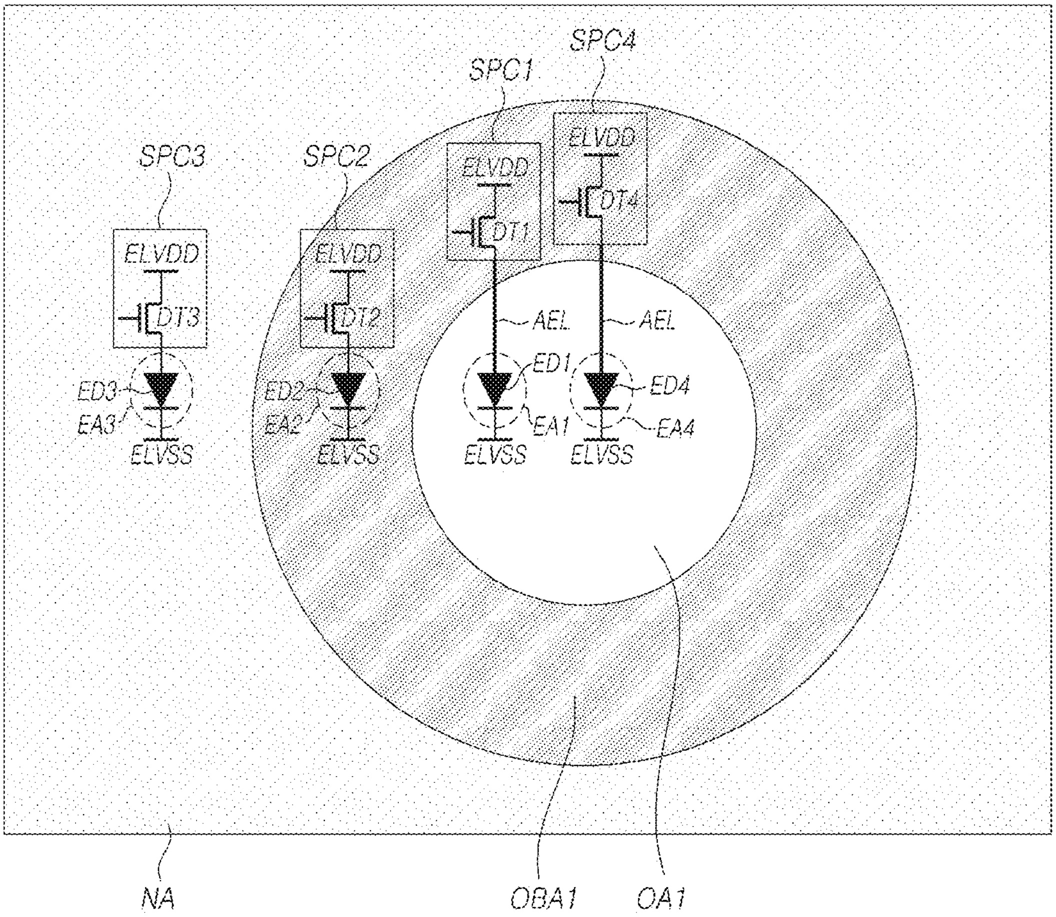
FIG. 6 is a view illustrating light emitting elements and pixel circuits for driving the light emitting elements disposed in a normal area, a first optical bezel area, and a first optical area in a display panel according to embodiments of the disclosure.

FIG. 6 illustrates light emitting elements ED1, ED2, ED3, and ED4 and pixel circuits SPC1, SPC2, SPC3, and SPC4 for respectively driving the light emitting elements ED1, ED2, ED3, and ED4 disposed in a normal area NA, a first optical bezel area OBA1, and a first optical area OA1 in a display panel 1100 according to embodiments of the disclosure.

However, each of the pixel circuits SPC1, SPC2, SPC3, and SPC4 may include transistors DT and ST and a storage capacitor Cst as shown in FIG. 3. However, for convenience of description, each of the pixel circuits SPC1, SPC2, SPC3, and SPC4 is briefly expressed as a driving transistor DT1, DT2, DT3, and DT4, respectively.

Referring to FIG. 6, the normal area NA, the first optical area OA1, and the first optical bezel area OBA1 may have structural differences as well as positional differences.

As a structural difference, the pixel circuits SPC1, SPC2, SPC3, and SPC may be disposed in the first optical bezel area OBA1 and the normal area NA, but no pixel circuit is disposed in the first optical area OA1. In other words, transistors DT1, DT2, DT3, and DT4 may be disposed in the first optical bezel area OBA1 and the normal area NA, but transistors are not disposed in the first optical area OA1.

The transistors and storage capacitors included in the pixel circuits SPC1, SPC2, SPC3, and SPC4 are components that may reduce transmittance. Accordingly, as the pixel circuits SPC1, SPC2, SPC3, and SPC are not disposed in the first optical area OA1, the transmittance of the first optical area OA1 may be further increased.

The pixel circuits SPC1, SPC2, SPC3, and SPC are disposed in the normal area NA and the first optical bezel area OBA1, but the light emitting elements ED1, ED2, ED3, and ED4 may be disposed in all of the normal area NA, the first optical bezel area OBA1, and the first optical area OA1.

Referring to FIG. 6, the first light emitting element ED1 is disposed in the first optical area OA1, but the first pixel circuit SPC1 for driving the first light emitting element ED1 is not disposed in the first optical area OA1.

Referring to FIG. 6, the first pixel circuit SPC1 for driving the first light emitting element ED1 disposed in the first optical area OA1 is not disposed in the first optical area OA1 but may be disposed in the first optical bezel area OBA1.

Described below in greater detail are the normal area NA, the first optical area OA1, and the first optical bezel area OBA1.

Referring to FIG. 6, a plurality of emission areas EA included in the display panel 110 according to embodiments of the disclosure may include a first emission area EA1, a second emission area EA2, and a third emission area EA3. Here, the first emission area EA1 may be included in the first optical area OA1. The second emission area EA2 may be included in the first optical bezel area OBA1. The third emission area EA3 may be included in the normal area NA. Hereinafter, it is assumed that the first emission area EA1, the second emission area EA2, and the third emission area EA3 are emission areas of the same color.

Referring to FIG. 6, the display panel 110 according to embodiments of the disclosure may include a first light emitting element ED1 disposed in the first optical area OA1 and having the first light emitting area EA1, a second light emitting element ED2 disposed in the first optical bezel area OBA1 and having the second light emitting area EA2, and a third light emitting element ED3 disposed in the normal area NA and having the third light emitting area EA3.

Referring to FIG. 6, the display panel 110 according to embodiments of the disclosure may further include the first pixel circuit SPC1 configured to drive the first light emitting element ED1, the second pixel circuit SPC2 configured to drive the second light emitting element ED2, and the third pixel circuit SPC3 configured to drive the third light emitting element ED3.

Referring to FIG. 6, the first pixel circuit SPC1 may include a first driving transistor DT1. The second pixel circuit SPC2 may include a second driving transistor DT2. The third pixel circuit SPC3 may include a third driving transistor DT3.

Referring to FIG. 6, in the display panel 110 according to embodiments of the disclosure, the second pixel circuit SPC2 may be disposed in the first optical bezel area OBA1 in which the corresponding second light emitting element ED2 is disposed, and the third pixel circuit SPC3 may be disposed in the normal area NA in which the corresponding third light emitting element ED3 is disposed.

Referring to FIG. 6, in the display panel 110 according to embodiments of the disclosure, the first pixel circuit SPC1 may not be disposed in the first optical area OA1 where the corresponding first light emitting device ED1 is disposed, but may be disposed in the first optical bezel area OBA1 positioned outside the first optical area OA1. Accordingly, the transmittance of the first optical area OA1 may be increased.

Referring to FIG. 6, the display panel 110 according to the embodiments of the disclosure may further include an anode extension line AEL that electrically connects the first pixel circuit SPC1 disposed in the first optical bezel area OBA1 and the first light emitting element ED1 disposed in the first optical area OA1.

The anode extension line AEL may electrically extend the anode electrode AE of the first light emitting element ED1 to the second node N2 of the first driving transistor DT1 in the first pixel circuit SPC1.

As described above, in the display panel 110 according to embodiments of the disclosure, the first pixel circuit SPC1 for driving the first light emitting element ED1 disposed in the first optical area OA1 may be disposed in the first optical bezel area OBA1, but not disposed in the first optical area OA1. Such a structure is also referred to as an anode extension structure. Accordingly, the first type of the first optical area OA1 is also referred to as an anode extension type.

When the display panel 110 according to embodiments of the disclosure has the anode extension structure, the whole or a portion of the anode extension line AEL may be disposed in the first optical area OA1, and the anode extension line AEL may include a transparent line. Accordingly, even when the anode extension line AEL connecting the first pixel circuit SPC1 and the first light emitting element ED1 is disposed in the first optical area OA1, it is possible to prevent or at least reduce a reduction in transmittance.

Referring to FIG. 6, the plurality of emission areas EA may further include a fourth emission area EA4 that emits light of the same color as the first emission area EA1 and is included in the first optical area OA1.

Referring to FIG. 6, the fourth emission area EA4 may be disposed adjacent to the first emission area EA1 in a row direction or column direction.

Referring to FIG. 6, the display panel 110 according to embodiments of the disclosure may further include a fourth light emitting element ED4 disposed in the first optical area OA1 and having the fourth emission area EA4, and a fourth pixel circuit SPC4 configured to drive the fourth light emitting element ED4.

Referring to FIG. 6, the fourth pixel circuit SPC4 may include a fourth driving transistor DT4. For convenience of description, the scan transistor ST and the storage capacitor Cst included in the fourth pixel circuit SPC4 are omitted from FIG. 6.

Referring to FIG. 6, the fourth pixel circuit SPC4 is a circuit for driving the fourth light emitting element ED4 disposed in the first optical area OA1, but may be disposed in the first optical bezel area OBA1.

Referring to FIG. 6, the display panel 110 according to embodiments of the disclosure may further include an anode extension line AEL that electrically connects the fourth pixel circuit SPC4 and the fourth light emitting element ED4.

The whole or a portion of the anode extension line AEL may be disposed in the first optical area OA1, and the anode extension line AEL may include a transparent line.

As described above, the first pixel circuit SPC1 disposed in the first optical bezel area OBA1 may drive one light emitting element ED1 disposed in the first optical area OA1. This circuit unit connection scheme is called a one-to-one (1:1) circuit unit connection scheme.

Accordingly, the number of pixel circuits SPC disposed in the first optical bezel area OBA1 may significantly increase. The structure of the first optical bezel area OBA1 may become complicated and the aperture ratio (or emission area) of the first optical bezel area OBA1 may decrease.

To increase the aperture ratio (or emission area) of the first optical bezel area OBA1 despite having the anode extension structure, the display device 100 according to embodiments of the disclosure may have a 1:N (where N is 2 or more) circuit unit connection scheme.

According to the 1:N circuit unit connection scheme, the first pixel circuit SPC1 disposed in the first optical bezel area OBA1 may simultaneously drive two or more light emitting elements ED disposed in the first optical area OA1.

Also, an anode connection line that extends from a first area (optical area) to the portion of a second area (normal area) that surrounds the first area, the anode connection line connecting the first light emitting diode in the first area and the first transistor that is in the portion of the second area that surrounds the first area.

Wherein the anode connection line further connects a third light emitting diode in another one of the plurality of first emission areas in the first area to the first transistor that is in the portion of the second area that surrounds the first area, Wherein the first light emitting diode and the third light emitting diode emit a same color of light.

Figure 10:
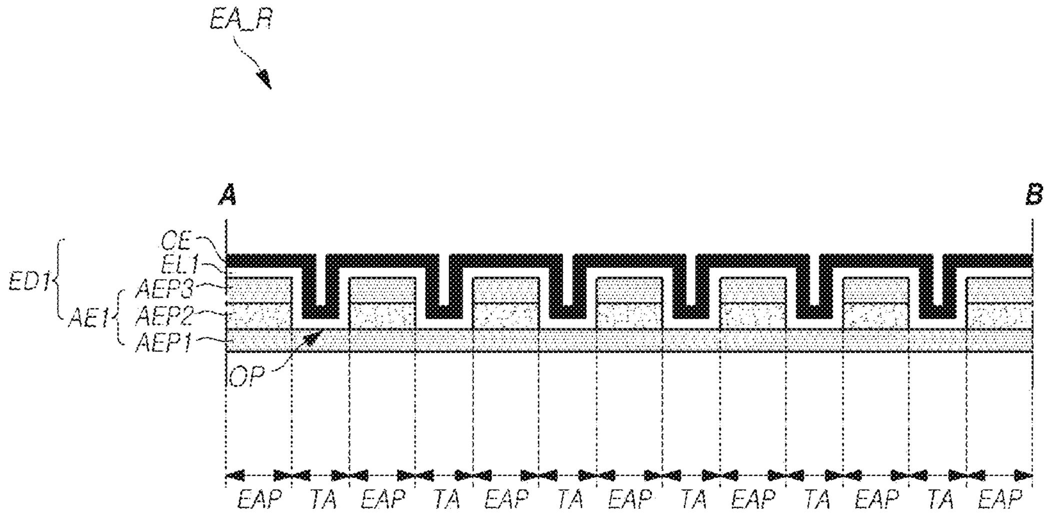

A third light emitting element in the first area, the third light emitting element including a third light emitting diode having an anode electrode having a number of protrusions and a number of depressions that are respectively different from a number of protrusions and a number of depressions included in the anode electrode of the first light emitting diode.

Wherein the one of the plurality of first emission areas that includes the first light emitting element includes a light transmission portion and a reflective portion.

Wherein the anode electrode of the first light emitting diode in the one of the plurality of first emission areas comprises, a first anode electrode pattern, a second anode electrode pattern on the first anode electrode pattern and a third anode electrode pattern on the second anode electrode pattern, wherein the first anode electrode pattern and the third anode electrode pattern include a transparent conductive material, and the second anode electrode pattern includes a reflective conductive material, and the second anode electrode pattern and the third anode electrode pattern include at least one opening through the second anode electrode pattern and the third anode electrode pattern, wherein the reflective portion of the one of the plurality of first emission areas corresponds to an area where the first anode electrode, the second anode electrode, and the third anode electrode are stacked, and the light transmission portion of the one of the plurality of first emission areas corresponds to an area overlapping the opening (It will be described in detail with reference to FIG. 10, etc.).

Wherein the cathode electrode comprises at least one hole through a thickness of the cathode electrode, and at least one of the plurality of light transmission areas of the first area corresponds to the at least one hole.

Figure 7:
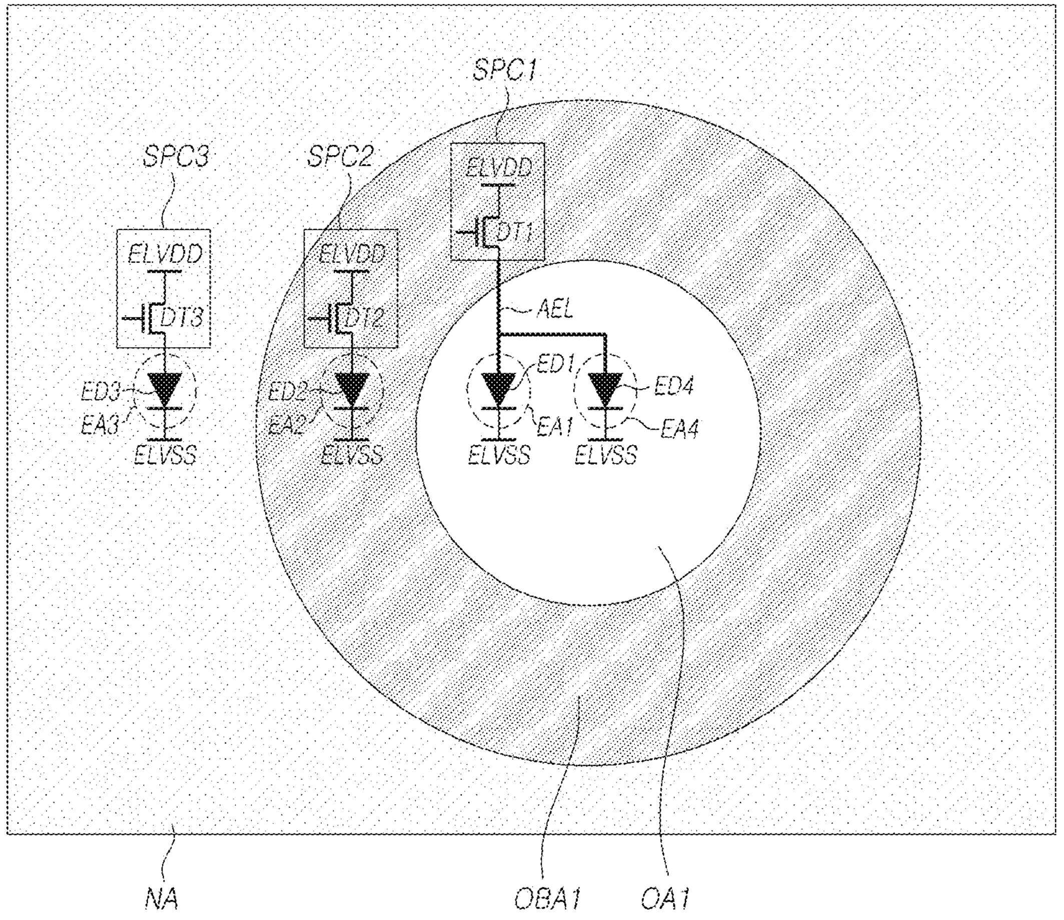
FIG. 7 is a view schematically illustrating light emitting elements and pixel circuits for driving the light emitting elements disposed in a normal area, a first optical bezel area, and a first optical area in a display panel according to embodiments of the disclosure.

FIG. 7 illustrates an example in which, for convenience of description, a 1:2 circuit unit connection scheme is applied, that is, the first pixel circuit SPC1 disposed in the first optical bezel area OBA1 simultaneously drives two or more light emitting elements ED1 and ED4 disposed in the first optical area OA1.

FIG. 7 schematically illustrates light emitting elements ED1, ED2, ED3, and ED4 and pixel circuits SPC1, SPC2, SPC3, and SPC4 for driving the light emitting elements ED1, ED2, ED3, and ED4 disposed in a normal area NA, a first optical bezel area OBA1, and a first optical area OA1 in a display panel 1100 according to embodiments of the disclosure.

Referring to FIG. 7, the fourth light emitting element ED4 disposed in the first optical area OA1 may be driven by the first pixel circuit SPC1 for driving the first light emitting element ED1 disposed in the first optical area OA1. In other words, the first pixel circuit SPC1 disposed in the first optical bezel area OBA1 may be configured to drive both the first light emitting element ED1 and the fourth light emitting element ED4 disposed in the first optical area OA1.

Accordingly, although the display panel 110 has the anode extension structure, the number of pixel circuits SPC disposed in the first optical bezel area OBA1 may be reduced, thereby increasing the opening and emission area of the first optical bezel area OBA1.

In FIG. 7, the first light emitting element ED1 and the fourth light emitting element ED4 driven together by the first pixel circuit SPC1 disposed in the first optical bezel area OBA1 are light emitting elements emitting light of the same color, and may be light emitting elements adjacent to each other in the row direction or column direction.

Referring to FIG. 7, the anode extension line AEL may connect the first pixel circuit SPC1 disposed in the first optical bezel area OBA1 to the first light emitting element ED1 and the fourth light emitting element ED4 disposed in the first optical area OA1.

Figure 8:
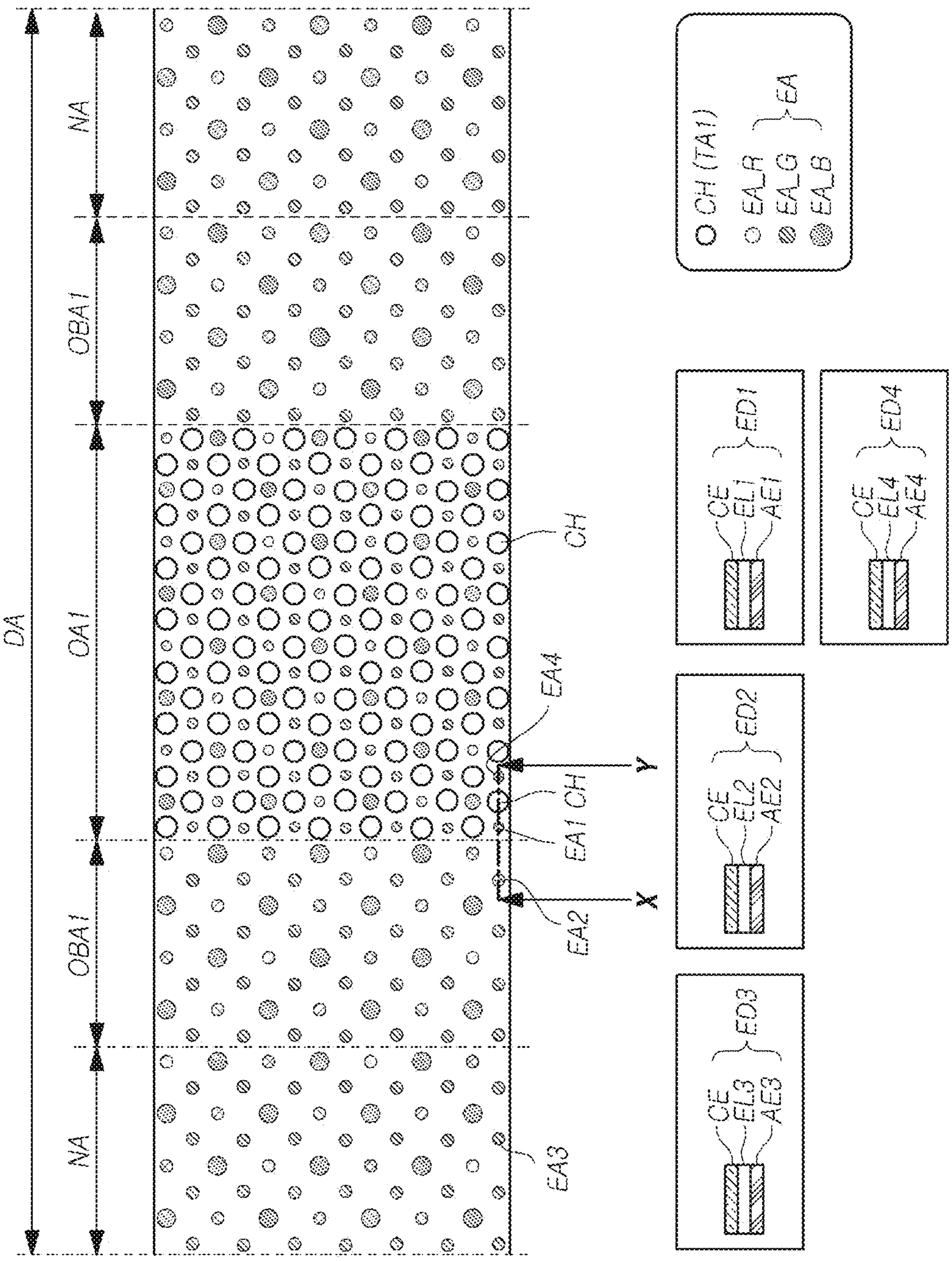
FIG. 8 is a plan view illustrating a normal area, a first optical bezel area, and a first optical area in a display panel according to embodiments of the disclosure.

FIG. 8 is a plan view illustrating a normal area NA, a first optical bezel area OBA1, and a first optical area OA1 in a display panel according to embodiments of the disclosure.

Referring to FIG. 8, in the display panel 110 according to embodiments of the disclosure, the plurality of emission areas EA disposed in each of the normal area NA, the first optical bezel area OBA, and the first optical area OA1 may include a red emission area EAR, a green emission area EA_G, and a blue emission area EA_B.

Referring to FIG. 8, in the display panel 110 according to embodiments of the disclosure, the cathode electrode CE may be commonly disposed in the normal area NA, the first optical bezel area OBA1, and the first optical area OA1.

The cathode electrode CE may include a plurality of cathode holes CH, and the plurality of cathode holes CH of the cathode electrode CE may be disposed in the first optical area OA1.

The normal area NA and first optical bezel area OBA1 may be an area where light is not transmissible, and the first optical area OA1 may be an area where light is transmissible. Thus, the transmittance in the first optical area OA1 may be higher than the transmittance in the first optical bezel area OBA1 and normal area NA.

The entire first optical area OA1 may be the area through which light may be transmitted, and the plurality of cathode holes CH within the first optical area OA1 may be first transmission areas TA1 through which light may be better transmitted. In other words, the remaining area of the first optical area OA1 that lack the plurality of cathode holes CH may be an area through which light may also be transmitted, and the transmittance of the plurality of cathode holes CH in the first optical area OA1 may be greater than the transmittance of the remaining area of the first optical area OA1 that lack the plurality of cathode holes CH.

In contrast, the plurality of cathode holes CH in the first optical area OA1 may be the transmission area TA through which light may be transmitted, and the remaining area of the first optical area OA1 that lack the plurality of cathode holes CH may be an area where light is not transmitted.

Referring to FIG. 8, the arrangement of the emission areas EA in the first optical area OA1, the arrangement of the emission areas EA in the first optical bezel area OBA1, and the arrangement of the emission areas EA in the normal area NA may be identical to each other.

Referring to FIG. 8, the plurality of emission areas EA may include a first emission area EA1 included in the first optical area OA1, a second emission area EA2 emitting light of the same color as the first emission area EA1 and included in a first optical bezel area OBA1, and a third emission area EA3 emitting light of the same color as the first emission area EA1 and included in the normal area NA.

Referring to FIG. 8, the plurality of emission areas EA may further include a fourth emission area EA4 that emits light of the same color as the first emission area EA1 and is included in the first optical area OA1.

Referring to FIG. 8, the display panel 110 according to embodiments of the disclosure may include a first anode electrode AE1 disposed in the first optical area OA1, a second anode electrode AE2 disposed in the first optical bezel area OBA1, a third anode electrode AE3 disposed in the normal area NA, and a fourth anode electrode AE4 disposed in the first optical area OA1.

The display panel 110 according to embodiments of the disclosure may further include a cathode electrode CE disposed in common with the normal area NA, the first optical bezel area OBA1, and the first optical area OA1.

The display panel 110 according to embodiments of the disclosure may include a first light emitting layer EL1 disposed in the first optical area OA1, a second light emitting layer EL2 disposed in the first optical bezel area OBA1, a third light emitting layer EL3 disposed in the normal area NA, and a fourth light emitting layer EL4 disposed in the first optical area OA1.

The first to fourth light emitting layers EL4 may be light emitting layers that emit light of the same color. In this case, the first to fourth light emitting layers EL4 may be separately disposed or be integrated as one layer.

Referring to FIG. 8, the first light emitting element ED1 may be formed by the first anode electrode AE1, the first light emitting layer EL1, and the cathode electrode CE, the second light emitting element ED2 may be formed by the second anode electrode AE2, the second light emitting layer EL2, and the cathode electrode CE, the third light emitting element ED3 may be formed by the third anode electrode AE3, the third light emitting layer EL3, and the cathode electrode CE, and the fourth light emitting element ED4 may be formed by the fourth anode electrode AE4, the fourth light emitting layer EL4, and the cathode electrode CE.

A structure of an emission area disposed in a first optical area and an anode electrode overlapping a portion of the emission area in a display device according to embodiments of the disclosure is described below with reference to FIGS. 9, 10, 11, and 12.

Figure 9:
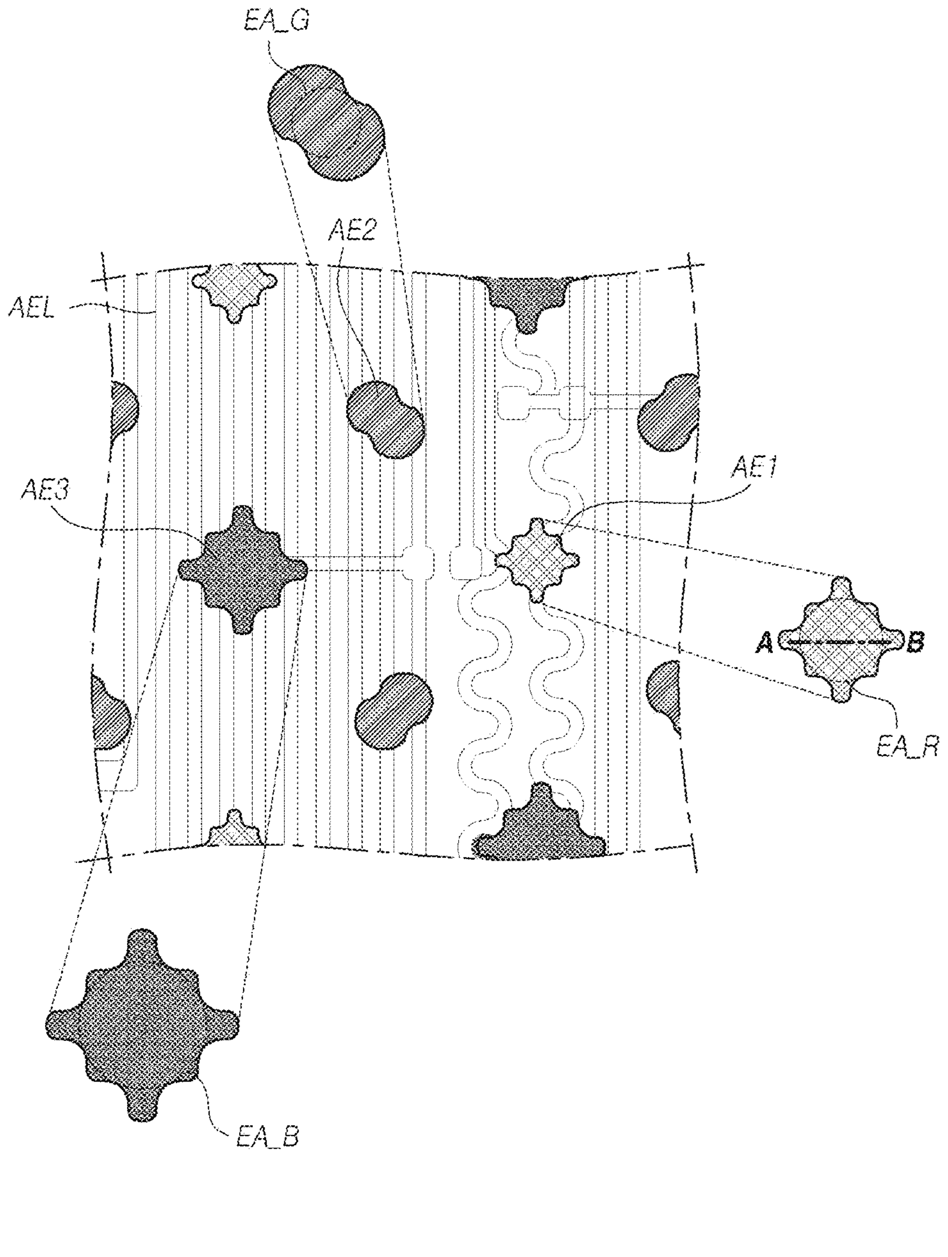
FIGS. 9, 10, 11, and 12 are views illustrating a structure of an emission area disposed in a first optical area and an anode electrode overlapping a portion of the emission area in a display device according to embodiments of the disclosure.
Figure 11:
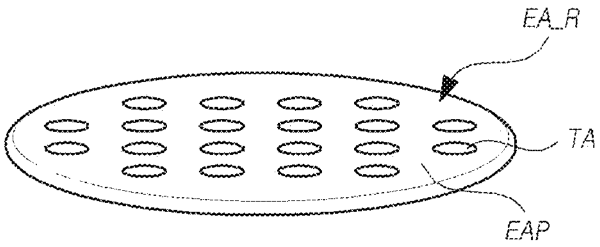
Figure 12:
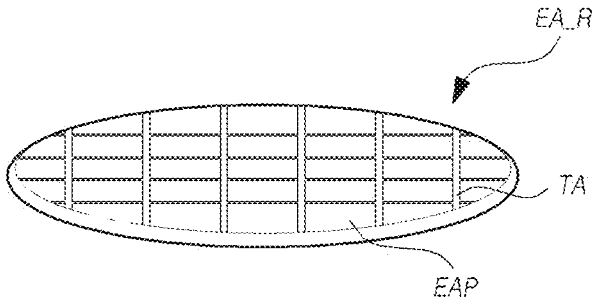

FIG. 9 is an enlarged view illustrating a portion of the first optical area OA1 of FIG. 8 according to one embodiment. FIG. 10 is a cross-sectional view taken along line A-B of FIG. 9 according to one embodiment. FIGS. 11 and 12 are views schematically illustrating the structure of one emission area disposed in FIG. 9 according to one embodiment.

For reference, FIG. 9 is a view schematically illustrating a plurality of anode extension lines AEL and a plurality of emission areas EA_R, EA_G, and EA_G disposed in the first optical area OA1. Line A-B of FIG. 9 described in connection with FIG. 10 is a cross-sectional view obtained by cutting one emission area disposed in the first optical area OA1, and a cross-section obtained by cutting the red emission area EA_R is described as an example. Further, the emission area in FIG. 9 means an area where the bank opening and the anode electrode overlap.

First, referring to FIG. 9, the first optical area OA1 may include a plurality of anode extension lines AEL and a plurality of emission areas EA_R, EA_G, and EA_G.

A plurality of emission areas emitting the same color may be connected to one anode extension line AEL, but embodiments of the disclosure are not limited thereto. For example, it may be formed to have the structure of FIG. 6.

Referring to FIG. 10, at least one of the plurality of emission areas disposed in the first emission area OA1 of the display device 100 according to embodiments of the disclosure may include a plurality of emission portions EAP and transmission portions TA disposed between the emission portions EAP.

For example, as illustrated in FIG. 10, a first light emitting element EA1 may be disposed in the red emission area EA_R disposed in the first optical area OA1.

Specifically, referring to FIG. 10, the first anode electrode AE1 may include a first anode electrode pattern AEP1, a second anode electrode pattern AEP2 disposed on the first anode electrode pattern AEP1, and a third anode electrode pattern AEP3 disposed on the second anode electrode pattern AEP2.

The planar shape of the first anode electrode pattern AEP1 including the first to third anode electrode patterns AEP1, AEP2, and AEP3 may include a plurality of protrusions 510 and a plurality of depressions 520 as shown in FIG. 5.

The first anode electrode pattern AEP1 and the third anode electrode pattern AEP3 may include a transparent conductive material. For example, the first anode electrode pattern AEP1 and the third anode electrode pattern AEP3 may include any one of indium tin oxide (ITO), indium zinc oxide (IZO), and indium gallium zinc oxide (IGZO), but embodiments of the disclosure are not limited thereto.

The second anode electrode pattern AEP2 may include a reflective conductive metal. For example, the second anode electrode pattern AEP2 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but embodiments of the disclosure are not limited thereto.

Referring to FIG. 10, the second and third anode electrode patterns AEP2 and AEP3 may include at least one opening OP exposing a portion of the upper surface of the first anode electrode pattern AEP1.

A halftone mask may be used to form the opening OP provided in the second and third anode electrode patterns AEP2 and AEP3, thereby forming the opening OP in the second anode electrode pattern AEP2 and the third anode electrode pattern AEP3 including different materials without adding a mask.

A first light emitting layer EL1 and a cathode electrode CE may be disposed on the first anode electrode AE1 including the first to third anode electrode patterns AEP1, AEP2, and AEP3.

The first light emitting layer EL1 and the cathode electrode CE may be disposed in an area where the first to third anode electrode patterns AEP1, AEP2, and AEP3 are stacked. Further, the first light emitting layer EL1 and the cathode electrode CE may be disposed in areas corresponding to the openings OP of the second and third anode electrode patterns AEP2 and AEP3. In other words, the first light emitting layer EL1 and the cathode electrode CE may also be disposed on the upper surface of the first anode electrode pattern AEP1 overlapping the opening OP.

The first anode electrode pattern AEP1 of the first light emitting element ED1 may be electrically connected to the pixel circuit SPC disposed in the first optical bezel area OBA1, and the first light emitting element ED1 may receive signals through the first anode electrode pattern AEP1.

Meanwhile, since the second anode electrode pattern AEP2 includes a reflective conductive material, sheet resistance may be lower than that of the first anode electrode pattern AEP1.

Accordingly, the signal applied through the first anode electrode pattern AEP1 may be transferred to the area where the second anode electrode pattern AEP2 is disposed. In other words, the signal applied to the first anode electrode pattern AEP1 may be concentrated in the area where the first to third anode electrode patterns AEP1, AEP2, and AEP3 are stacked so that light may be emitted from the area where the electrode patterns AEP1, AEP2, and AEP3 are stacked.

Further, in the openings OP of the second and third anode electrode patterns AEP2 and AEP3, no light may be emitted, or light having a lower luminance than the area in which the first to third anode electrode patterns AEP1, AEP2, and AEP3 is stacked may be emitted.

Meanwhile, as illustrated in FIG. 10, as the second and third anode electrode patterns AEP2 and AEP3 include at least one opening OP in the red light emitting area EA_R of the first optical area OA1, it is possible to increase the area of the transmission portion TA.

In other words, as at least one transmission portion TA is included in the red emission area EA_R, the transmittance of the first optical area OA1 may be enhanced.

As shown in FIGS. 11 and 12, the red emission area EAR disposed in the first optical area OA1 may include an emission portion EAP and a transmission portion TA.

For example, as illustrated in FIG. 11, the red light emitting area EA_R may include a plurality of transmission portions TA spaced apart from each other and an emission portion EAP surrounding the plurality of transmission portions TA.

As illustrated in FIG. 12, the red emission area EA_R may include a mesh-shaped transmission portion TA, and the remaining area may be configured as an emission portion EAP.

FIGS. 10 to 12 describe the red emission area EA_R and the structure of the first anode electrode AE1 disposed in the red emission area EA_R as an example, but the display device 100 according to embodiments of the disclosure is not limited thereto.

For example, the structure of FIGS. 10 to 12 may be applied to at least one emission area disposed in the first optical area OA1 and the anode electrode disposed in the emission area.

Hereinafter, the cross-sectional structure taken along the X-Y line of FIG. 8 is described in more detail through FIGS. 13 to 16.

The portion taken along line X-Y of FIG. 8 includes a portion of the first optical bezel area OBA1 and a portion of the optical area OA1 with respect to the boundary between the first optical bezel area OBA1 and the first optical area OA1.

The portion taken along line X-Y of FIG. 8 may include the first light emitting area EA1 and the fourth light emitting area EA4 included in the first optical area OA1, and the second light emitting area EA2 included in the first optical bezel area OBA1. The first emitting area EA1, fourth emitting area EA4, and second emitting area EA2 are examples of emission areas EAs that emit the same color of light.

Figure 13:
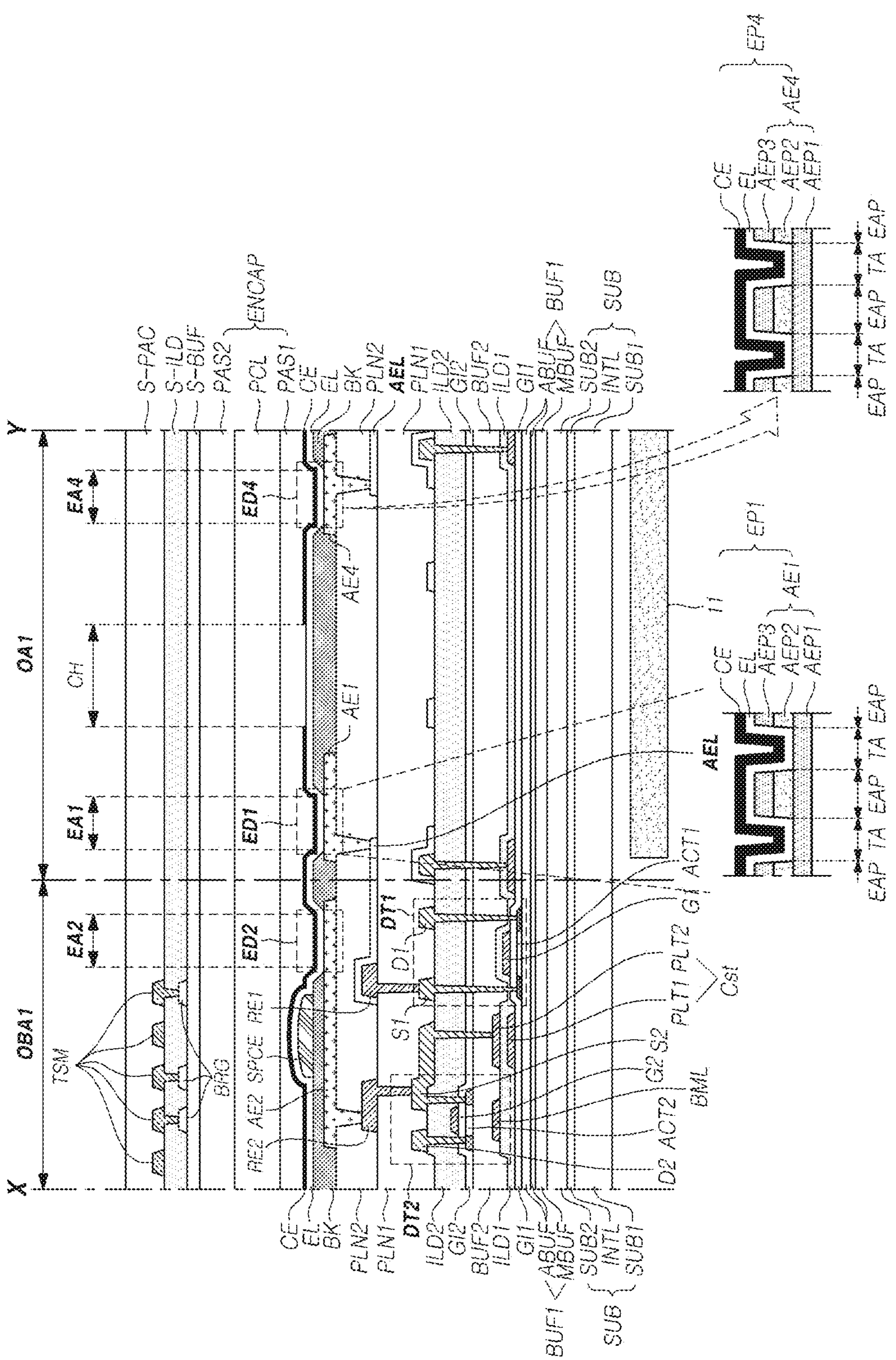
FIGS. 13 and 14 are cross-sectional views illustrating a first optical bezel area and a first optical area of a display panel according to embodiments of the disclosure.
Figure 14:
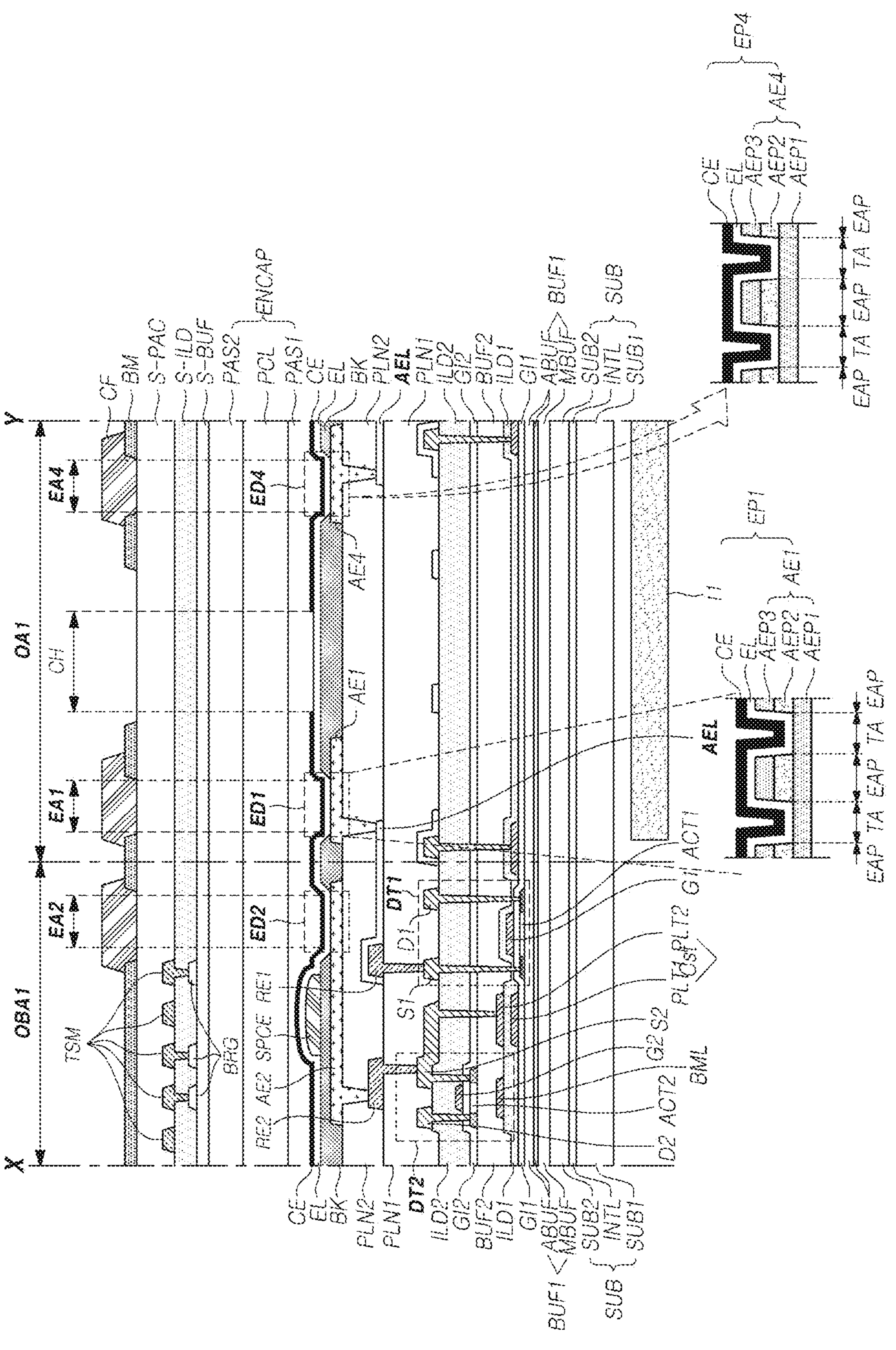

FIGS. 13 and 14 are cross-sectional views illustrating a first optical bezel area OBA1 and a first optical area OA1 of a display panel 110 according to embodiments of the disclosure. However, FIGS. 13 and 14 are cross-sectional views when the 1:1 circuit connection scheme is applied as in FIG. 6.

Referring to FIG. 13, when viewed in a vertical structure, the display panel 110 may include a transistor forming part, a light emitting element forming part, and an encapsulation part.

The transistor forming part may include a substrate SUB, a first buffer layer BUF1 on the substrate SUB, and various transistors DT1 and DT2, storage capacitor Cst, and various electrodes or signal lines formed on the first buffer layer BUF.

The substrate SUB may include a first substrate SUB1 and a second substrate SUB2. An intermediate film INTL may be present between the first and second substrates SUB1 and SUB2. For example, the intermediate film INTL may be an inorganic film and may block moisture penetration.

The first buffer layer BUF1 may be a single film or multi-film structure. When the first buffer layer BUF1 is formed in a multi-film structure, the first buffer layer BUF1 may include a multi-buffer layer MBUF and an active buffer layer ABUF.

Various transistors DT1 and DT2, storage capacitor Cst, and various electrodes or signal lines may be formed on the first buffer layer BUF1.

For example, the transistors DT1 and DT2 formed on the first buffer layer BUF1 are formed of the same material and on the same layer. Alternatively, as illustrated in FIG. 13, among the transistors DT1 and DT2, the first driving transistor DT1 and the second driving transistor DT2 may be formed of different materials and may be positioned on different layers.

Referring to FIG. 13, the first driving transistor DT1 may be a driving transistor DT for driving the first light emitting element ED1 included in the first optical area OA1, and the second driving transistor DT2 may be a driving transistor DT for driving the second light emitting element ED2 included in the first optical bezel area OBA1.

In other words, the first driving transistor DT1 may be a driving transistor included in the first pixel circuit SPC1 for driving the first light emitting element ED1 included in the first optical area OA1, and the second driving transistor DT2 may be a driving transistor included in the second pixel circuit SPC2 for driving the second light emitting element ED2 included in the first optical bezel area OBA1.

The formation of the first driving transistor DT1 and the second driving transistor DT2 is described below.

The first driving transistor DT1 may include a first active layer ACT1, a first gate electrode G1, a first source electrode S1, and a first drain electrode D1.

The second driving transistor DT2 may include a second active layer ACT2, a second gate electrode G2, a second source electrode S2, and a second drain electrode D2.

The second active layer ACT2 of the second driving transistor DT2 may be positioned higher than the first active layer ACT1 of the first driving transistor DT1.

A first buffer layer BUF1 may be disposed under the first active layer ACT1 of the first driving transistor DT1, and a second buffer layer BUF2 may be disposed under the second active layer ACT2 of the second driving transistor DT2.

In other words, the first active layer ACT1 of the first driving transistor DT1 may be positioned on the first buffer layer BUF1, and the second active layer ACT2 of the second driving transistor DT2 may be positioned on the second buffer layer BUF2. Here, the second buffer layer BUF2 may be positioned higher than the first buffer layer BUF1.

The first active layer ACT1 of the first driving transistor DT1 may be disposed on the first buffer layer BUF1, and a first gate insulation film GI1 may be formed on the first active layer ACT1 of the first driving transistor DT1. The first gate electrode G1 of the first driving transistor DT1 may be disposed on the first gate insulation film GI1, and a first inter-layer insulation film ILD1 may be disposed on the first gate electrode G1 of the first driving transistor DT1.

Here, the first active layer ACT1 of the first driving transistor DT1 may include a first channel area overlapping the first gate electrode G1, a first source connection area positioned on one side of the first channel area, and a channel area, and a first drain connection area positioned on the other side of the channel area.

A second buffer layer BUF2 may be disposed on the first inter-layer insulation film ILD1.

The second active layer ACT2 of the second driving transistor DT2 may be disposed on the second buffer layer BUF2, and a second gate insulation film GI2 may be disposed on the second active layer ACT2. The second gate electrode G2 of the second driving transistor DT2 may be disposed on the second gate insulation film GI2, and a second inter-layer insulation film ILD2 may be disposed on the second gate electrode G2.

Here, the second active layer ACT2 of the second driving transistor DT2 may include a second channel area overlapping the second gate electrode G2, a second source connection area positioned on one side of the second channel area, and a second drain connection area positioned on the other side of the channel area.

The first source electrode S1 and the first drain electrode D1 of the first driving transistor DT1 may be disposed on the second inter-layer insulation film ILD2. The second source electrode S2 and the second drain electrode D2 of the second driving transistor DT2 may be disposed on the second inter-layer insulation film ILD2.

The first source electrode S1 and the first drain electrode D1 of the first driving transistor DT1 may be connected with the first source connection area and the first drain connection area, respectively, of the first active layer ACT1 through the through holes of the second inter-layer insulation film ILD2, the second gate insulation film GI2, the second buffer layer BUF2, the first inter-layer insulation film ILD1, and the first gate insulation film GI1.

The second source electrode S2 and the second drain electrode D21 of the second driving transistor DT2 may be connected with the second source connection area and the second drain connection area, respectively, of the second active layer ACT2 through the through holes in the second inter-layer insulation film ILD2 and the second gate insulation film GI2.

In FIG. 13, the first driving transistor DT1 and the storage capacitor Cst included in the second pixel circuit SPC2 are shown, with other transistors omitted. In FIG. 13, the first driving transistor DT1 included in the first pixel circuit SPC1 is shown, with other transistors and storage capacitor omitted.

Referring to FIG. 13, the storage capacitor Cst included in the second pixel circuit SPC2 may include a first capacitor electrode PLT1 and a second capacitor electrode PLT2.

The first capacitor electrode PLT1 may be electrically connected to the second gate electrode G2 of the second driving transistor DT2, and the second capacitor electrode PLT2 may be electrically connected to the second source electrode S2 of the second driving transistor DT2.

Meanwhile, referring to FIG. 13, a lower metal BML may be disposed under the second active layer ACT2 of the second driving transistor DT2. The lower metal BML may overlap the whole or part of the second active layer ACT2.

For example, the lower metal BML may be electrically connected to the second gate electrode G2. As another example, the lower metal BML may serve as a light shield to block the light introduced from thereunder. In this case, the lower metal BML may be electrically connected to the second source electrode S2.

The first driving transistor DT1 is a transistor for driving the first light emitting element ED1 disposed in the first optical area OA1, but may be disposed in the first optical bezel area OBA1.

The second driving transistor DT2 is a transistor for driving the second light emitting element ED2 disposed in the first optical bezel area OBA1, and may be disposed in the first optical bezel area OBA1.

Referring to FIG. 13, a first planarization layer PLN1 may be disposed on the first driving transistor DT1 and the second driving transistor DT2. In other words, the first planarization layer PLN1 may be disposed on the first source electrode S1 and the first drain electrode D2 of the first driving transistor DT1 and the second source electrode S2 and the second drain electrode D2 of the second driving transistor DT2.

Referring to FIG. 13, a first relay electrode RE1 and a second relay electrode RE2 may be disposed on the first planarization layer PLN1.

Here, the first relay electrode RE1 may be an electrode that relays an electrical connection between the first source electrode S1 of the first driving transistor DT1 and the first anode electrode AE1 of the first light emitting element ED1. The second relay electrode RE2 may be an electrode that relays an electrical connection between the second source electrode S2 of the second driving transistor DT2 and the second anode electrode AE2 of the second light emitting element ED2.

The first relay electrode RE1 may be electrically connected to the first source electrode S1 of the first driving transistor DT1 through a hole in the first planarization layer PLN1. The second relay electrode RE2 may be electrically connected to the second source electrode S2 of the second driving transistor DT2 through another hole in the first planarization layer PLN1.

Referring to FIG. 13, the first relay electrode RE1 and the second relay electrode RE2 may be disposed in the first optical bezel area OBA1.

Meanwhile, referring to FIG. 13, the anode extension line AEL may be connected to the first relay electrode RE1 and may extend from the first optical bezel area OBA1 to the first optical area OA1.

Referring to FIG. 13, the anode extension line AEL is a metal layer formed on the first relay electrode RE1 and may be formed of a transparent material.

Referring to FIG. 13, a second planarization layer PLN2 may be disposed covering the first relay electrode RE1, the second relay electrode RE2, and the anode extension line AEL.

Referring to FIG. 13, a light emitting element forming part may be positioned on the second planarization layer PNL2.

Referring to FIG. 13, the light emitting element forming part may include a first light emitting element ED1, a second light emitting element ED2, and a fourth light emitting element ED4 formed on the second planarization layer PNL2.

Referring to FIG. 13, the first light emitting element ED1 and the fourth light emitting element ED4 may be disposed in the first optical area OA1, and the second light emitting element ED2 may be disposed in the first optical bezel area OBA1.

In the example of FIG. 13, the first light emitting element ED1, the second light emitting element ED2, and the fourth light emitting element ED4 are light emitting elements emitting light of the same color. Hereinafter, it is assumed that the respective light emitting layers EL of the first light emitting element ED1, the second light emitting element ED2, and fourth light emitting element ED4 are formed in common, although they may be formed separately.

Referring to FIG. 13, the first light emitting element ED1 may be formed in an area where the first anode electrode AE1, the light emitting layer EL, and the cathode electrode CE overlap. The second light emitting element ED2 may be formed in an area where the second anode electrode AE2, the light emitting layer EL, and the cathode electrode CE overlap. The fourth light emitting element ED4 may be formed in an area where the fourth anode electrode AE4, the light emitting layer EL, and the cathode electrode CE overlap.

Referring to FIG. 13, the first anode electrode AE1, the second anode electrode AE2, and the fourth anode electrode AE4 may be disposed on the second planarization layer PLN2.

The second anode electrode AE2 may be connected to the second relay electrode RE2 through a hole in the second planarization layer PLN2.

The first anode electrode AE1 may be connected to the anode extension line AEL extending from the first optical bezel area OBA1 to the first optical area OA1 through another hole in the second planarization layer PLN2.

The fourth anode electrode AE4 may be connected to another anode extension line AEL extending from the first optical bezel area OBA1 to the first optical area OA1 through another hole in the second planarization layer PLN2.

Referring to FIG. 13, a bank BK may be disposed on the first anode electrode AE1, the second anode electrode AE2, and the fourth anode electrode AE4.

The bank BK may include a plurality of bank holes. The respective portions of the first anode electrode AE1, the second anode electrode AE2, and the fourth anode electrode AE4 may be exposed through the plurality of bank holes. In other words, the plurality of bank holes formed in the bank BK may overlap the respective portions of the first anode electrode AE1, the second anode electrode AE2, and the fourth anode electrode AE4.

Referring to FIG. 13, a light emitting layer EL may be disposed on the bank BK. The light emitting layer EL may contact a portion of the first anode electrode AE1, a portion of the second anode electrode AE2, and a portion of the fourth anode electrode AE4 through a plurality of bank holes.

Referring to FIG. 13, at least one space SPCE may be present between the light emitting layer EL and the bank BK.

Referring to FIG. 13, the cathode electrode CE may be disposed on the light emitting layer EL. The cathode electrode CE may include a plurality of cathode holes CH. In one embodiment, each cathode hole CH extends through an entire thickness of the cathode electrode CE. A plurality of cathode holes CH formed in the cathode electrode CE may be disposed in the first optical area OA1.

One cathode hole CH illustrated in FIG. 13 is a cathode hole positioned between the first emission area EA1 and the fourth emission area EA4.

Referring to FIG. 13, the first emission area EA1 and the fourth emission area EA4 disposed in the first optical area OA1 may include a plurality of emission portions EAP and a plurality of transmission portions TA as illustrated in FIGS. 10 to 12. Here, the emission portion EAP may be an area where the first to third anode electrode patterns AEP1, AEP2, and AEP3 are stacked in each of the first and fourth anode electrodes AE1 and AE4, and the transmission portion TA may be an area where the first anode electrode pattern AEP1 is disposed but the second and third anode electrode patterns AEP2 and AEP3 are not disposed.

Through such a structure, transmittance of the first optical area OA1 may be enhanced.

Referring to FIG. 13, an encapsulation part may be positioned on the cathode electrode CE. The encapsulation part may include an encapsulation layer ENCAP formed on the cathode electrode CE.

Referring to FIG. 13, the encapsulation layer ENCAP may be a layer that prevents or at least reduces penetration of moisture or oxygen into the light emitting elements ED1, ED2, and ED4 disposed under the encapsulation layer ENCAP. In particular, the encapsulation layer ENCAP may prevent or at least reduces penetration of moisture or oxygen into the light emitting layer EL, which may include an organic film. Here, the encapsulation layer ENCAP may be composed of a single film or a multi-film structure.

Referring to FIG. 13, the encapsulation layer ENCAP may include a first encapsulation layer PAS1, a second encapsulation layer PCL, and a third encapsulation layer PAS2. The first encapsulation layer PAS1 and the third encapsulation layer PAS2 may be inorganic films, and the second encapsulation layer PCL may be an organic layer.

As the second encapsulation layer PCL is formed of an organic film, the second encapsulation layer PCL may serve as a planarization layer.

Meanwhile, the display panel 110 according to embodiments of the disclosure may include a touch sensor. In this case, the display panel 110 according to embodiments of the disclosure may include a touch sensor portion formed on the encapsulation layer ENCAP.

Referring to FIG. 13, the touch sensor portion may include touch sensor metals TSM and bridge metals BRG and may further include insulation film components, such as a sensor buffer layer S-BUF, a sensor inter-layer insulation film S-ILD, and a sensor protection layer S-PAC.

The sensor buffer layer S-BUF may be disposed on the encapsulation layer ENCAP. The bridge metals BRG may be disposed on the sensor buffer layer S-BUF. The sensor inter-layer insulation film S-ILD may be disposed on the bridge metals BRG.

The touch sensor metals TSM may be disposed on the sensor inter-layer insulation film S-ILD. Some of the touch sensor metals TSM may be connected to the corresponding bridge metal BRG through a hole in the sensor inter-layer insulation film S-ILD.

Referring to FIG. 13, the touch sensor metals TSM and the bridge metals BRG may be disposed in the first optical bezel area OBAL. The touch sensor metals TSM and the bridge metals BRG may be disposed not to overlap the second emission area EA2 of the first optical bezel area OBA1.

The plurality of touch sensor metals TSM may configure one touch electrode (or one touch electrode line) and may be disposed in a mesh form and electrically connected. Some of the touch sensor metals TSM and some others of the touch sensor metals TSM may be electrically connected through a bridge metal BRG, configuring one touch electrode (or one touch electrode line).

The sensor protection layer S-PAC may be disposed while covering the touch sensor metals TSM and the bridge metals BRG.

Meanwhile, when the display panel 110 is of a type that incorporates touch sensors, at least a portion of the touch sensor metal TSM positioned on the encapsulation layer ENCAP in the display area DA may extend and be disposed along the outer inclined surface of the encapsulation layer ENCAP to electrically connect to a pad positioned further outside the outer inclined surface of the encapsulation layer ENCAP. Here, the pad may be disposed in the non-display area NDA and may be a metal pattern to which the touch driving circuit 260 is electrically connected.

The display panel 110 according to embodiments of the disclosure may further include a bank BK positioned on the first anode electrode AE1 and having a bank hole exposing a portion of the first anode electrode AE1 and a light emitting layer EL positioned on the bank BK and contacting a portion of the first anode electrode AE1 exposed through the bank hole.

The bank hole formed in the bank BK may not overlap the plurality of cathode holes CH. At the point where the cathode hole CH is positioned, the bank BK is not depressed or bored through. Therefore, at the point where the cathode hole CH is positioned, the second planarization layer PLN2 and the first planarization layer PLN1 positioned under the bank BK are not depressed or bored through either.

An upper surface of the bank BK positioned under the plurality of cathode holes CH may be in a flat state without being damaged, meaning that the insulation layer, metal pattern (electrodes or lines), or light emitting layer EL positioned under the cathode electrode CE is not damaged by the process of forming the plurality of cathode holes CH in the cathode electrode CE.

The process of forming the plurality of cathode holes CH in the cathode electrode CE is briefly described below. A specific mask pattern is deposited in positions where a plurality of cathode holes CH are to be formed, and a cathode electrode material is deposited thereon. Accordingly, the cathode electrode material may be deposited only in an area without the specific mask pattern, so that the cathode electrode CE having a plurality of cathode holes CH may be formed. For example, the specific mask pattern may include an organic material. The cathode electrode material may include a magnesium-silver (Mg—Ag) alloy.

Meanwhile, after the cathode electrode CE having the plurality of cathode holes CH is formed, the display panel 110 may be in a state in which the specific mask pattern is completely removed or in a state in which the whole or part of the specific mask pattern remains.

The display panel 110 according to embodiments of the disclosure may include a first driving transistor DT1 disposed in the first optical bezel area OBA1 to drive the first light emitting element ED1 disposed in the first optical area OA1 and a second driving transistor DT2 disposed in the first optical bezel area OBA1 to drive the second light emitting element ED2 disposed in the first optical bezel area OBA1.

The display panel 110 according to embodiments of the disclosure may further include a first planarization layer PLN1 disposed on the first driving transistor DT1 and the second driving transistor DT2, the first relay electrode RE1 positioned on the first planarization layer PLN1 and electrically connected to the first source electrode S1 of the first driving transistor DT1 through a hole of the first planarization layer PLN1, the second relay electrode RE2 positioned on the first planarization layer PLN1 and electrically connected to the second source electrode S2 of the second driving transistor DT2 through another hole of the first planarization layer PLN1, and the second planarization layer PLN2 disposed on the first relay electrode RE1 and the second relay electrode RE2.

The display panel 110 according to embodiments of the disclosure may further include the anode extension line AEL connecting the first relay electrode RE1 and the first anode electrode AE1 and positioned on the first planarization layer PLN1.

The second anode electrode AE2 may be electrically connected to the second relay electrode RE2 through a hole in the second planarization layer PLN2, and the first anode electrode AE1 may be electrically connected to the anode extension line AEL through another hole in the second planarization layer PLN2.

The whole or a portion of the anode extension line AEL may be disposed in the first optical area OA, and the anode extension line AEL may include a transparent material.

The first pixel circuit SPC1 may include a first driving transistor DT1 for driving the first light emitting element ED1. The second pixel circuit SPC2 may include a second driving transistor DT2 for driving the second light emitting element ED2.

The first active layer ACT1 of the first driving transistor DT1 and the second active layer ACT2 of the second driving transistor DT2 may be different from each other.

The display panel 110 according to embodiments of the disclosure may further include a substrate SUB, a first buffer layer BUF1 disposed between the substrate SUB and the first driving transistor DT1, and a second buffer layer BUF2 disposed between the first driving transistor DT1 and the second driving transistor DT2.

The first active layer ACT1 of the first driving transistor DT1 and the second active layer ACT2 of the second driving transistor DT2 may comprise different semiconductor materials.

For example, the second active layer ACT2 of the second driving transistor DT2 may include an oxide semiconductor material. For example, the oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), and zinc indium tin oxide (ZITO).

For example, the first active layer ACT1 of the first driving transistor DT1 and the second active layer ACT2 of the second driving transistor DT2 may comprise different semiconductor materials.

For example, the first active layer ACT1 of the first driving transistor DT1 may include a silicon-based semiconductor material. For example, the silicon-based semiconductor material may include low-temperature polycrystalline silicon (LTPS) or the like.

The display panel 110 according to embodiments of the disclosure may further include an encapsulation layer ENCAP on a first light emitting element ED1, a second light emitting element ED2, and a third light emitting element ED3, and a touch sensor metal TSM on the encapsulation layer ENCAP.

The touch sensor metal TSM may be disposed in the normal area NA and the first optical bezel area OBA1.

Referring to FIG. 13, the first optical area OA1 may overlap the first optical electronic device 11. The first optical bezel area OBA1 may not overlap the first optical electronic device 11. In some cases, a portion of the first optical bezel area OBA1 may overlap the first optical electronic device 11.

Referring to FIG. 13, the cross-sectional structure of the normal area NA may be the same as that of the first optical bezel area OBA. However, the first pixel circuit SPC1 disposed in the first optical bezel area OBA1 to drive the first light emitting element ED1 disposed in the first optical area OA1 is not disposed in the normal area NA.

Meanwhile, referring to FIG. 14, a color filter CF may be disposed which overlaps at least one emission area EA1, EA2, and EA4 among the emission areas disposed in the first optical area OA1 and the first optical bezel area OBA1 of the display device 100 according to embodiments of the disclosure.

Further, a black matrix BM may be disposed to prevent light leakage between adjacent emission areas.

Specifically, referring to FIG. 14, the black matrix BM and the color filter CF may be disposed on a portion of the upper surface of the sensor protection layer S-PAC.

Referring to FIG. 14, the black matrix BM and the color filter CF may be disposed not to overlap the plurality of cathode holes CH.

Through such a structure, the color purity of the light emitted from the first optical area OA1 may be enhanced while securing the transmittance of the first optical area OA1.

Figure 15:
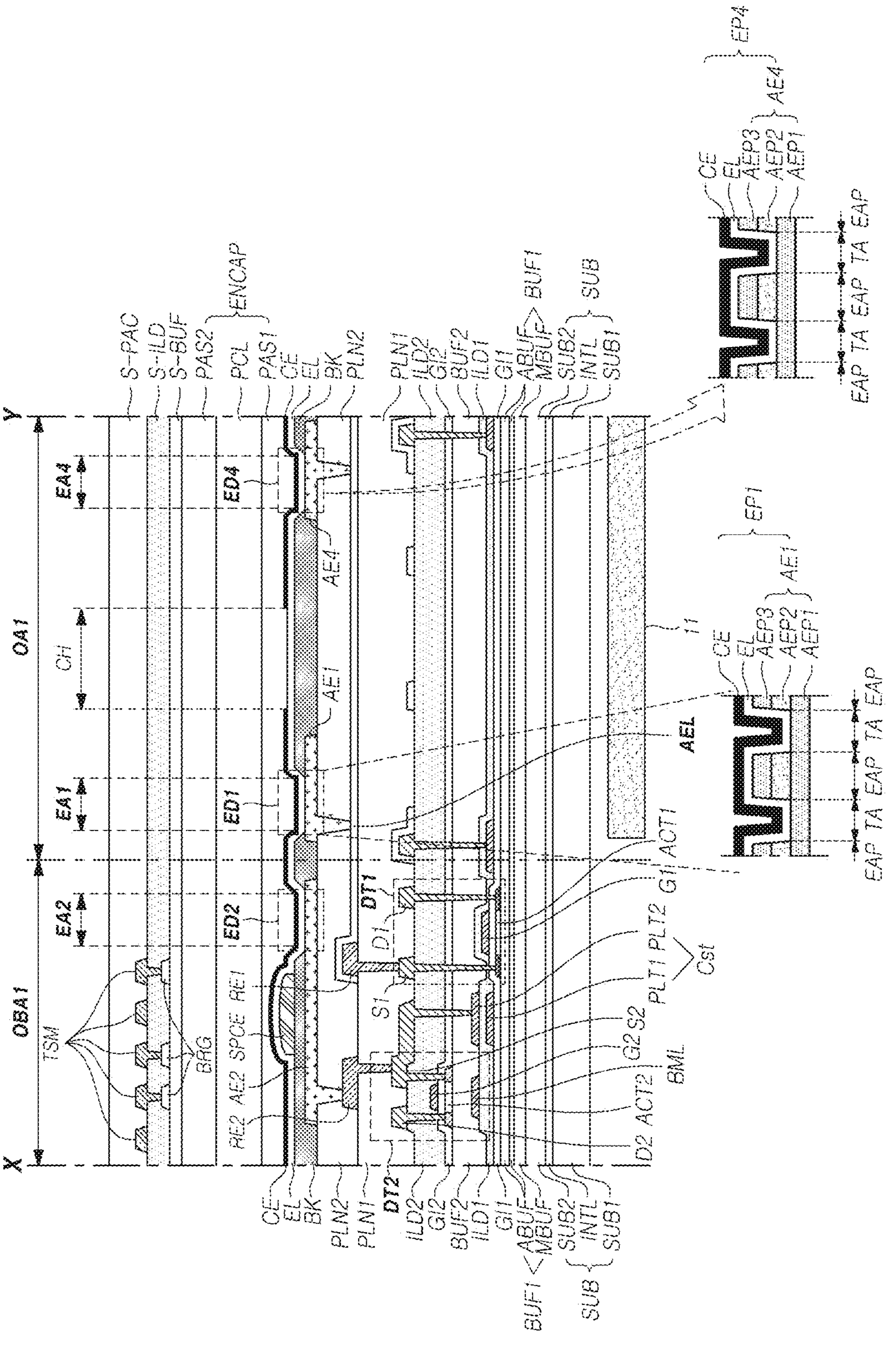
FIGS. 15 and 16 are cross-sectional views illustrating a first optical bezel area and a first optical area of a display panel according to embodiments of the disclosure.
Figure 16:
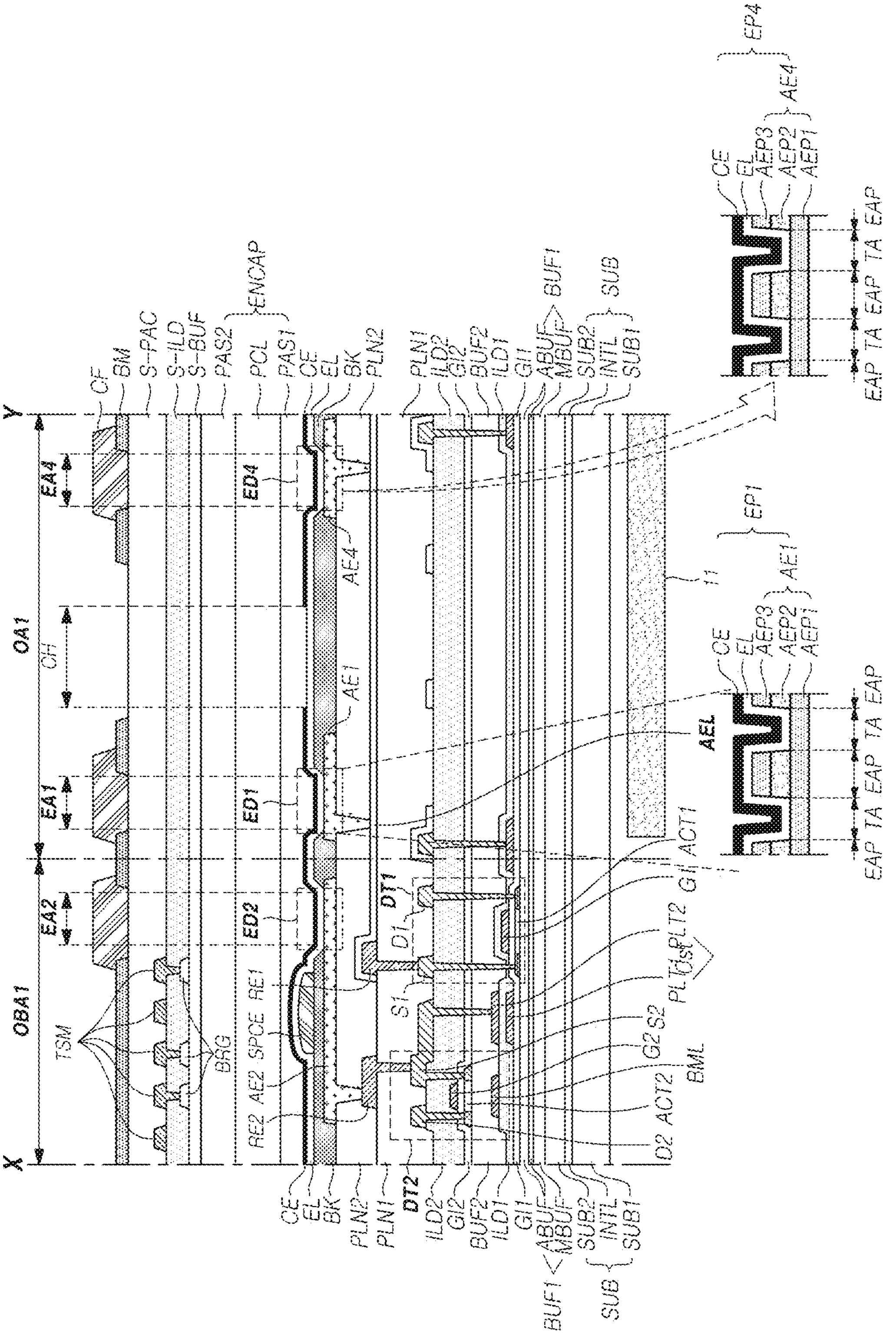

FIGS. 15 and 16 are cross-sectional views illustrating a first optical bezel area OBA1 and a first optical area OA1 of a display panel 110 according to embodiments of the disclosure. However, FIG. 15 is a cross-sectional view when the 1:2 circuit connection scheme is applied as in FIG. 7.

The cross-sectional view of FIG. 15 is basically the same as the cross-sectional view of FIG. 13. The difference is that the cross-sectional view of FIG. 13 adopts the 1:1 circuit unit connection scheme shown in FIG. 5 while the cross-sectional view of FIG. 15 adopts the 1:2 circuit unit connection scheme shown in FIG. 7. Thus, the following description of the cross-sectional structure of FIG. 15 focuses primarily on differences from the cross-sectional structure of FIG. 13.

Referring to FIG. 15, the first light emitting element ED1 and the fourth light emitting element ED4 disposed in the first optical area OA1 may be simultaneously driven by the first driving transistor DT1 disposed in the first optical bezel area OBA1.

Therefore, as illustrated in FIG. 15, the anode extension line AEL may be further electrically connected to the fourth anode electrode AE4 different from the first anode electrode AE1. In other words, the anode extension line AEL may be electrically connected to both the first anode electrode AE1 of the first light emitting element ED1 and the fourth anode electrode AE4 of the fourth light emitting element ED4.

Referring to FIG. 15, the first emission area EA1 by the first light emitting element ED1 and the fourth emission area EA4 by the fourth light emitting element ED4 may be emission areas emitting light of the same color.

Further, referring to FIG. 16, a color filter CF may be disposed which overlaps at least one emission area EA1, EA2, and EA4 among the emission areas disposed in the first optical area OA1 and the first optical bezel area OBA1 of the display device 100 according to embodiments of the disclosure.

Further, a black matrix BM may be disposed to prevent light leakage between adjacent emission areas.

As illustrated in FIG. 16, the black matrix BM and color filter CF may be disposed on the sensor protection layer S-PAC and may be disposed not to overlap a plurality of cathode holes CH.

Figure 17:
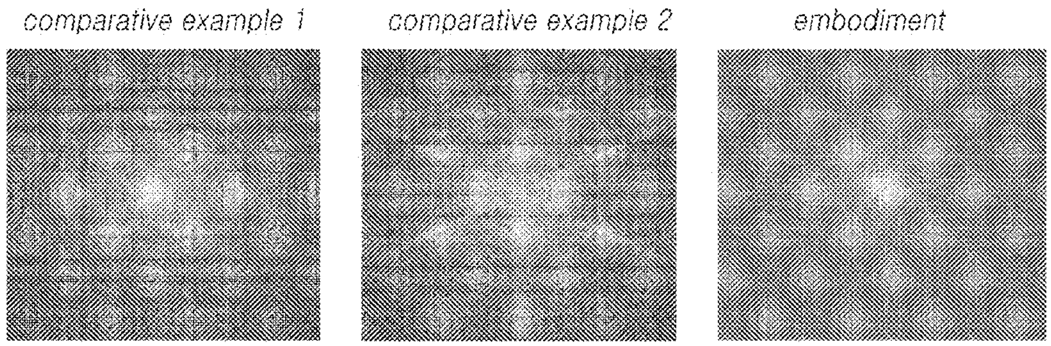
FIG. 17 is an image illustrating a flare occurring in a display device according to comparative examples and an optical state of a display device according to embodiments which may mitigate a flare.

FIG. 17 is an image illustrating a flare occurring in a display device according to comparative examples and an optical state of a display device according to embodiments which may mitigate a flare.

Comparative example 1 of FIG. 17 has a structure in which the anode electrodes of the light emitting elements disposed to correspond to the area in which the camera is positioned are circular at plan view, and there is no cathode hole. Comparative example 2 has the structure in which anode electrodes of light emitting elements disposed to correspond to the area in which the camera is positioned are circular at plan view and polygonal cathode holes are present at plan view. As illustrated in FIGS. 4 and 5, a display device according to an embodiment has a structure in which the outer shape of the anode electrodes of the plurality of light emitting elements disposed in the first optical area OA1 are angle-less shapes other than circular or elliptical shapes, and circular or elliptical cathode holes CH are disposed.

Referring to FIG. 17, in the display devices according to comparative example 1 and comparative example 2, it may be identified that circular and diagonal flares occur severely in the area where the camera is disposed.

On the other hand, it may be identified that in the display device according to the embodiment, the flare phenomenon in the first optical area OA1 is mitigated as compared to the display devices according to the comparative examples, and accordingly, the displayed image becomes clear and sharp.

Figure 18:
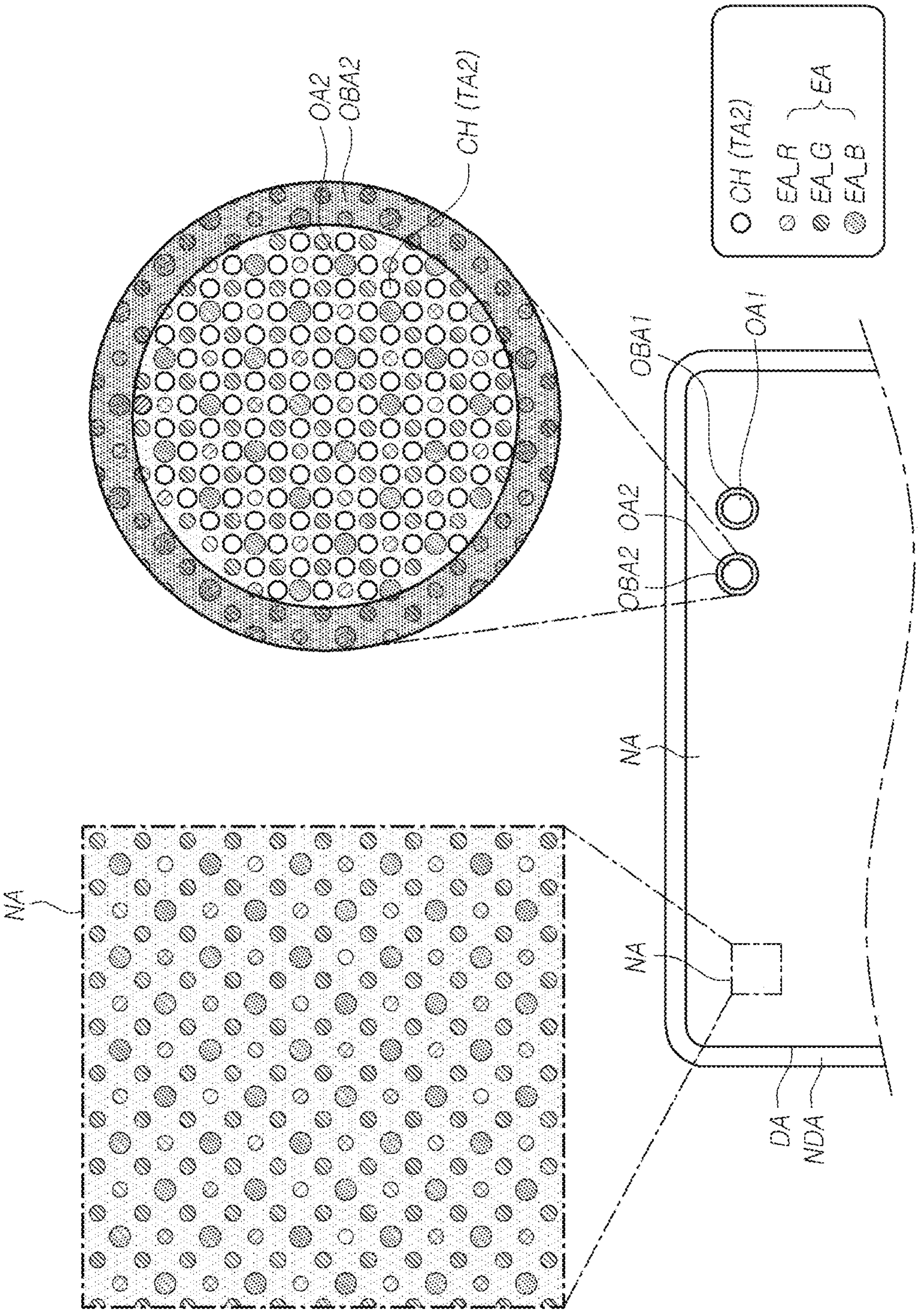
FIG. 18 schematically illustrates a second optical area of a first type and a normal area around the first optical area in a display panel according to embodiments of the disclosure.

FIG. 18 schematically illustrates a second optical area OA2 of a first type and a normal area NA around the second optical area OA2 in a display panel 110 according to embodiments of the disclosure.

Referring to FIG. 18, the display area DA may further include the second optical area OA2 adjacent to the first optical area OA1. Like the first optical area OA1, the second optical area OA2 may also be configured in a first type (an anode extension type).

In this case, the display area DA may further include a second optical bezel area OBA2 between the second optical area OA2 and the normal area NA.

Two or more light emitting elements ED may be disposed in each of the first optical area OA1 and the second optical area OA2.

A transistor is not disposed in each of the first optical area OA1 and the second optical area OA2. The pixel circuit SPC for driving the two or more light emitting elements ED disposed in the second optical area OA2 may be disposed in the second optical bezel area OBA2.

What has been described with reference to FIGS. 5 to 16 may be equally applied to the second optical area OA2 and the second optical bezel area OBA2. However, the transmittance of the second optical area OA2 may be different from the transmittance of the first optical area OA1.

Figure 19:
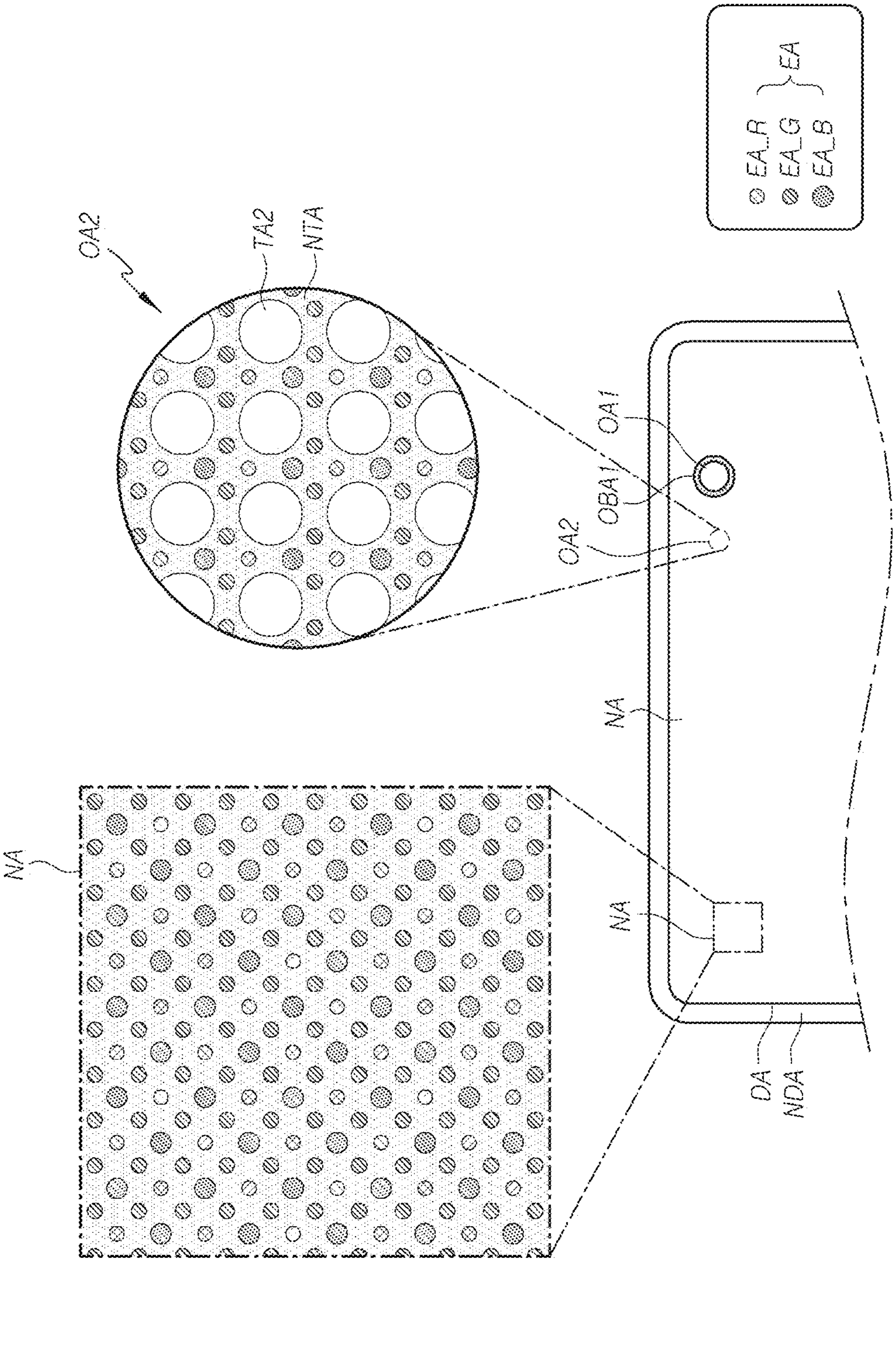
FIG. 19 schematically illustrates a second optical area of a second type and a normal area around the first optical area in a display panel according to embodiments of the disclosure.

FIG. 19 schematically illustrates a second optical area OA2 of a second type and a normal area NA around the second optical area OA2 in the display panel 110 according to embodiments of the disclosure.

Referring to FIG. 19, the display area DA may include the second optical area OA2. When the second optical area OA2 has a second type structure that is different from the first type structure, the second optical area OA2 may include a plurality of transmission areas TA2 and a non-transmission area NTA. Here, the second type is also referred to as a hole type.

In the second optical area OA2, the non-transmission area NTA may be an area other than the plurality of transmission areas TA2.

Referring to FIG. 19, the non-transmission area NTA may include a plurality of emission areas EA. A plurality light emitting elements ED for the plurality of emission areas EA may be disposed in the non-transmission area NTA.

Further, a plurality of pixel circuits SPC for driving the plurality of light emitting elements ED may be disposed in the non-transmission area NTA. In other words, the plurality of pixel circuits SPC may be disposed in the second optical area OA2. This is different from the first optical area OA1 in which the plurality of pixel circuits SPC are not disposed.

Accordingly, the transistors DT and ST and the storage capacitors Cst may not be disposed in the first optical area OA1, and the transistors DT and ST and the storage capacitors Cst may be disposed in the second optical area OA2.

In other words, two or more light emitting elements ED may be disposed in the first optical area OA1, and two or more light emitting elements ED may be disposed in the non-transmission area NTA of the second optical area OA2. In contrast, transistors may not be disposed in the first optical area OA1, and transistors may be disposed in the second optical area OA2.

Referring to FIG. 19, the arrangement of the emission areas EA in the second optical area OA2 may be the same as the arrangement of the emission areas EA in the normal area NA, and may be the same as the arrangement of the emission areas EA in the first optical area OA1.

Further, referring to FIG. 19, the area of each of the plurality of emission areas EA included in the second optical area OA2 may be the same as or different, within a predetermined range, from the area of each of the plurality of emission areas EA included in the normal area NA.

Further, the area of each of the plurality of emission areas EA included in the second optical area OA2 may be the same as or different, within a predetermined range, from the area of each of the plurality of emission areas EA included in the first optical area OA1.

The whole or part of the first optical area OA1 may overlap the first optical electronic device 11, and the whole or part of the second optical area OA2 may overlap the second optical electronic device 12.

The transmittance of the first optical area OA1 and the transmittance of the second optical area OA2 may be higher than the transmittance of the normal area NA.

For example, the first optical electronic device 11 may be a camera, and the second optical electronic device 12 may be a sensor different from the camera.

For example, the first optical electronic device 11 may be a device that performs a predetermined operation by receiving visible light, and the second optical electronic device 12 may be a device that performs a predetermined operation by receiving light (e.g., infrared or ultraviolet light) different from visible light.

For example, when the first optical electronic device 11 is a device that requires more light than the second optical electronic device 12, the transmittance of the first optical area OA1 may be greater than or equal to the transmittance of the second optical area OA2.

Figure 20:
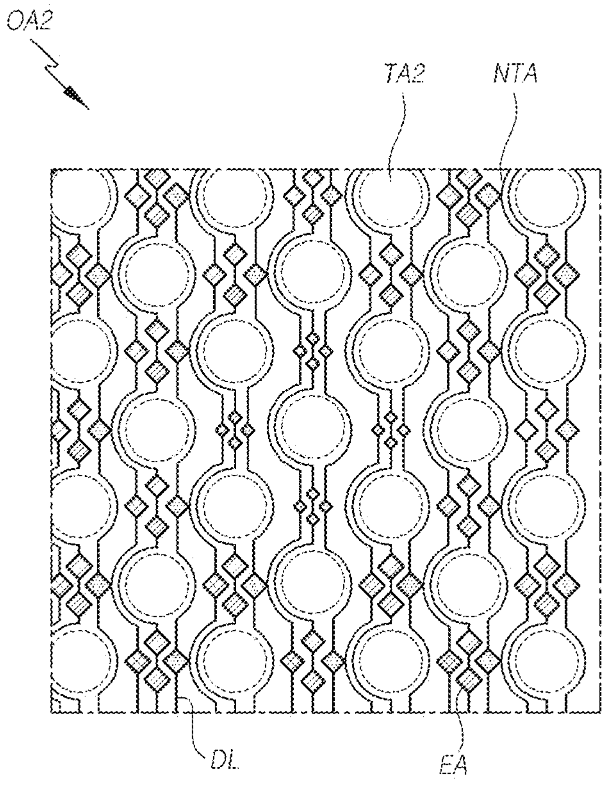
FIG. 20 is a plan view illustrating a second optical area of a second type in a display panel according to embodiments of the disclosure.

FIG. 20 is a plan view illustrating a second optical area OA2 of a second type in a display panel 110 according to embodiments of the disclosure.

Referring to FIG. 20, when the second optical area OA2 is of the second type, the second optical area OA2 may include a non-transmission area NTA and a second transmission area TA2 except for the non-transmission area NTA.

The non-transmission area NTA may include a plurality of emission areas EA.

The light emitting element ED may be disposed in each of the plurality of emission areas EA.

Pixel circuits SPC for driving the light emitting elements ED may be disposed in the non-transmission area NTA.

In the second optical area OA2 of the second type, the light emitting elements ED and the pixel circuits SPC may partially overlap each other.

In the second optical area OA2 of the second type, the data lines DL and the gate lines GL may pass through the second optical area OA2. In FIG. 20, the gate lines GL are omitted, and when each of the data lines DL extends in the column direction, each of the gate lines GL may extend in the row direction.

The data lines DL and the gate lines GL may be disposed in the second optical area OA2 while disposed around the second transmission area TA2.

The data lines DL and the gate lines GL may be connected to pixel circuits SPC disposed in the second optical area OA2.

According to embodiments of the disclosure, there may be provided a display device and a display panel having a light transmission structure in which an optical electronic device may normally receive light (e.g., visible light, infrared light, or ultraviolet light) without exposing the optical electronic device through the front surface of the display device.

According to embodiments of the disclosure, there may be provided a display device and a display panel having a unique arrangement structure for a light emitting element and a pixel circuit for driving the light emitting element in an optical area to enhance transmittance of the optical area.

According to embodiments of the disclosure, there may be provided a display device and a display panel having a unique connecting structure between a pixel circuit and a light emitting element to enhance transmittance in an optical area.

According to embodiments of the disclosure, there may be provided a display device and a display panel having a structure in which a transmission portion is present in an emission area disposed in an optical area to enhance transmittance of the optical area.

According to embodiments of the disclosure, there may be provided a display device and a display panel capable of low-power implementation by prolonging the lifespan of the light emitting element disposed in the optical area while enhancing the quality of the image obtained by the optical electronic device disposed in the optical area as the outer shape of the anode electrode disposed in the optical area is a curve other than a circle or ellipse.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A display device, comprising:

a first optical area included in a display area, the first optical area configured to display an image and being light transmittable;

a normal area included in the display area, the normal area around the first optical area; and a first optical bezel area included in the display area, the first optical bezel area positioned between the first optical area and the normal area, wherein each of the first optical area, the first optical bezel area, and the normal area includes a plurality of emission areas, wherein each of the plurality of emission areas in the first optical area includes a light emitting element comprising an anode electrode, a light emitting layer, and a cathode electrode, wherein an outer shape of at least one anode electrode in the first optical area comprises a plurality of protrusions and a plurality of depressions that are alternately arranged in a plan view of the display device, and wherein at least one of the plurality of emission areas in the first optical area includes a light transmission portion and a reflective portion that surrounds the light transmission portion.

2. The display device of claim 1, wherein a plurality of anode electrodes are in the first optical area, and an outer shape of at least one of the plurality of anode electrodes is different from an outer shape of another anode electrode from the plurality of anode electrodes in the plan view of the display device.

3. The display device of claim 1, wherein at least one anode electrode from a plurality of anode electrodes in the first optical area includes:

a first anode electrode pattern on a substrate;

a second anode electrode pattern on the first anode electrode pattern; and a third anode electrode pattern on the second anode electrode pattern, wherein the first anode electrode pattern and the third anode electrode pattern include a transparent conductive material, and the second anode electrode pattern includes a reflective conductive material, and the second anode electrode pattern and the third anode electrode pattern include at least one opening through the second anode electrode pattern and the third anode electrode pattern.

4. The display device of claim 3, wherein the at least one opening extends to a portion of an upper surface of the first anode electrode pattern.

5. The display device of claim 4, wherein a first portion of the light emitting layer and a first portion of the cathode electrode that is non-overlapping with the at least one opening are on the first anode electrode pattern, the second anode electrode pattern, and the third anode electrode pattern in the first optical area, and a second portion of the light emitting layer and a second portion of the cathode electrode that is overlapping with the at least one opening is on the first anode electrode pattern through the at least one opening.

6. The display device of claim 3, wherein the reflective portion corresponds to an area where the first anode electrode pattern, the second anode electrode pattern, and the third anode electrode pattern are stacked, and the light transmission portion corresponds to an area overlapping the at least one opening.

7. The display device of claim 3, wherein the at least one emission area includes a plurality of light transmission portions that are spaced apart from each other, and the reflective portion surrounds the plurality of light transmission portions.

8. The display device of claim 3, wherein the light transmission portion in the at least one emission area comprises a mesh shape, and the reflective portion surrounds the light transmission portion.

9. The display device of claim 1, wherein an anode electrode is in the normal area and an anode electrode is in the first optical bezel area, and an outer shape of the anode electrode in the normal area and an outer shape of the anode electrode in the first optical bezel area are different from an outer shape of the at least one anode electrode in the first optical area.

10. The display device of claim 1, wherein a total number of the plurality of protrusions and a total number of the plurality of depressions of the at least one anode electrode in the first optical area is different from a total number of protrusions and a total number of depressions of at least another anode electrode from a plurality of anode electrodes in the first optical area.

11. The display device of claim 1, wherein a transistor is in the first optical bezel area, and the first optical area lacks any transistors.

12. The display device of claim 1, further comprising:

a plurality of pixel circuits in the first optical bezel area; and a first anode extension line extending from the first optical bezel area to the first optical area, the first anode extension line electrically connecting at least one first anode electrode in the first optical area and a pixel circuit from the plurality of pixel circuits that is in the first optical bezel area, wherein the first anode extension line is transparent.

13. The display device of claim 1, wherein the first optical area includes at least one cathode hole in the cathode electrode, and wherein the at least one cathode hole comprises a circular shape or an elliptical shape.

14. The display device of claim 1, further comprising:

an encapsulation layer on the light emitting element in the first optical area; and a color filter on the encapsulation layer in the first optical area, the color filter overlapping the plurality of emission areas in the first optical area.

15. A display panel, comprising:

a first optical area included in a display area, the first optical area configured to display an image and being light transmittable;

a normal area included in the display area, the normal area around the first optical area; and a first optical bezel area included in the display area, the first optical bezel area between the first optical area and the normal area, wherein each of the first optical area, the first optical bezel area, and the normal area includes a plurality of emission areas, and wherein at least one of the plurality of emission areas in the first optical area includes a light transmission portion and a reflective portion that surrounds the light transmission portion.

16. The display panel of claim 15, further comprising:

a plurality of anode electrodes in the plurality of emission areas of the first optical area, wherein at least one of the plurality of anode electrodes includes:

a first anode electrode pattern on a substrate;

a second anode electrode pattern on the first anode electrode pattern; and a third anode electrode pattern on the second anode electrode pattern, wherein the first anode electrode pattern and the third anode electrode pattern include a transparent conductive material, and the second anode electrode pattern includes a reflective conductive material, and the second anode electrode pattern and the third anode electrode pattern include at least one opening through the second anode electrode pattern and the third anode electrode pattern.

17. The display panel of claim 16, wherein the reflective portion corresponds to an area where the first anode electrode pattern, the second anode electrode pattern, and the third anode electrode pattern are stacked, and the light transmission portion corresponds to an area overlapping the at least one opening.

18. The display panel of claim 15, further comprising:

an anode electrode included in one of the plurality of emission areas in the first optical area, the anode electrode having an outer shape including a plurality of protrusions and a plurality of depressions that are alternately arranged in a plan view of the display panel.

19. A display panel comprising:

a display area including a first area and a second area that surrounds the first area in a plan view of the display panel, the first area having a plurality of first emission areas configured to emit light and a plurality of light transmission areas, and the second area having a plurality of second emission areas configured to emit light but lacks a light transmission area;

a first light emitting element including a first light emitting diode in one of the plurality of first emission areas in the first area and a first transistor connected to the first light emitting diode, the first transistor in a portion of the second area that surrounds the first area;

a second light emitting element including a second light emitting diode in one of the plurality of second emission areas in the second area and a second transistor connected to the second light emitting diode, the second transistor in the second area; and an optical electronic device that overlaps the first area of the display panel, wherein the first light emitting diode in the first area includes an anode electrode, a light emitting layer on the anode electrode, and a cathode electrode, the anode electrode having an outer shape comprising a plurality of protrusions and a plurality of depressions that are alternately arranged in the plan view of the display panel.

* * * * *